(12) United States Patent
Iwaki et al.

(10) Patent No.: US 7,385,286 B2
(45) Date of Patent: Jun. 10, 2008

(54) SEMICONDUCTOR MODULE

(75) Inventors: Hideki Iwaki, Osaka (JP); Tetsuyoshi Ogura, Osaka (JP); Yutaka Taguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 92 days.

(21) Appl. No.: 10/161,719

(22) Filed: Jun. 5, 2002

(65) Prior Publication Data

US 2002/0180063 A1    Dec. 5, 2002

(30) Foreign Application Priority Data

Jun. 5, 2001    (JP)    ............................ P2001-169487

(51) Int. Cl.
  H01L 23/34    (2006.01)
  H01L 23/52    (2006.01)
  H01L 23/48    (2006.01)
  H01L 23/495    (2006.01)
  H01G 4/228    (2006.01)
  H05K 1/18    (2006.01)

(52) U.S. Cl. ..................... 257/724; 257/691; 257/692; 257/E23.062; 361/306.3; 361/306.2; 361/763

(58) Field of Classification Search ................ 257/724, 257/698, 532, 691, 692, E23.062; 361/763, 361/306.3, 306.2
See application file for complete search history.

(56) References Cited

U.S. PATENT DOCUMENTS 6,184,577 B1 *  2/2001  Takemura et al. .......... 257/701
6,370,013 B1 *  4/2002  Iino et al. ................ 361/306.3
6,407,929 B1 *  6/2002  Hale et al. .................. 361/763
6,532,143 B2 *  3/2003  Figueroa et al. ......... 361/301.4
6,611,419 B1 *  8/2003  Chakravorty ............ 361/306.3

FOREIGN PATENT DOCUMENTS

| JP | 62-32334 | 8/1994 |
| JP | 6-164150 | 10/1994 |
| JP | 06-302760 | 10/1994 |
| JP | 6-302760 | 10/1994 |

OTHER PUBLICATIONS

Japanese Office Action issued in corresponding Japanese Patent Application No. JP 2002-163868, dated Sep. 12, 2006.

* cited by examiner

Primary Examiner—Luan Thai
(74) Attorney, Agent, or Firm—McDermott Will & Emery LLP

(57) ABSTRACT

At least four terminal electrodes are provided on a surface of multi-layer substrate main body. An electric functional layer is selectively provided at an internal area of said multi-layer substrate placed at a downward position of all terminal electrodes in a substrate thickness direction. A semiconductor device is flip-chip-bonded to the terminal electrodes. Thus, the semiconductor device is electrically connected to the electric functional layer at a short distance. As a result, a reduction in parasitic inductance and an improvement in high frequency characteristic can be accomplished. Generation of height variations between the terminal electrodes can be prevented, and the semiconductor device is stably flip-chip-bonded to the multi-layer substrate.

28 Claims, 17 Drawing Sheets

50.0 MHz    FREQ    13.51 GHz 50.0 MHz    FREQ    13.51 GHz

SEMICONDUCTOR MODULE

FIELD OF THE INVENTION

The present invention relates to a semiconductor module in which an electric functional layer such as an electrical electric functional element is built-in.

BACKGROUND OF THE INVENTION

There has been provided a semiconductor module that a semiconductor device is mounted on a multi-layer substrate. A substrate structure which can be used as the multi-layer substrate for configuring such semiconductor module is disclosed in Japanese Patent Application Laid-Open No. 164150 (1994).

A capacitive element layer is provided within the multi-layer substrate. The capacitive element layer has a dielectric layer and a pair of internal electrodes disposed so as to face with each other with the dielectric layer being interposed therebetween. The dielectric layer is selectively provided only at the substrate area that the capacitive element layer is provided. Terminal electrodes are provided on a surface of the multi-layer substrate. One terminal electrode is provided immediately above the internal electrode, and electrically connected via a via hole formed at the multi-layer substrate to the internal electrode. The other terminal electrode is drawn to a side of the multi-layer substrate, and is connected to a side electrode which is formed at the side of the multi-layer substrate.

In the semiconductor module used in a high frequency band (1 MHz to dozens GHz), improvements in high frequency characteristic become a problem. Examples of the improvements in high frequency characteristic include easy design of cut-off frequency (i.e., a frequency serving as a boundary between a passing band and an attenuation band), widening of the band, improvements in distortion characteristic, reduction in parasitic capacitance component (including a parasitic inductance) caused by mounting, and the like.

As described above, the high frequency characteristic can be improved to a certain extent in the semiconductor module that a semiconductor device is mounted on a conventional multi-layer substrate (Japanese Patent Application Laid-Open No. 164150 (1994)).

In such semiconductor module, however, height variations occur between the terminal electrode which is placed above the capacitive element layer (which is electrically connected via a via hole to the internal electrode) and the terminal electrode which is not placed above the capacitive element layer (which is electrically connected via a internal wiring to the side electrode).

In a case of structure that three or less connected portions between the semiconductor device and the multi-layer substrate are provided (i.e., the number of terminal electrodes is three or less), even if the height variations are generated, a flat surface connecting the connected portions always exists. Nevertheless, in a case of structure that four or more connected portions are provided (i.e., the number of terminal electrodes is four or more), if the height variations are generated, a flat surface connecting the connected portions cannot be formed. As a result, when the semiconductor device is flip-chip-bonded to the multi-layer substrate with four or more connected portions (four or more terminal electrodes), a clearance may be generated between the semiconductor device and the terminal electrode due to the above-described height variations of the terminal electrodes. Thus, it is difficult to perform stable flip-chip-bonding of the semiconductor device.

Furthermore, in accordance with the semiconductor module, the height variations may be larger due to the following reasons. Namely, in order to reduce a parasitic capacitance component which presents a problem in the semiconductor module, the semiconductor device must be connected to the capacitive element layer at a distance that is as short as possible. In order to perform such short distance connection, it is proposed that a length of a via hole (which connects an electrode layer constituting the capacitive element layer to a terminal electrode provided at the surface of multi-layer substrate) is made short. In order to make the length of the via hole short, a thickness of the substrate area that the via hole is formed must be thin. Nevertheless, the via hole is placed above the capacitive element layer, and the substrate area that the via hole is formed refers to as the substrate area that the capacitive element layer is formed. For this reason, if the thickness of the substrate area that the via hole is formed is made thin, a ratio of thickness of capacitive element layer to a total thickness of the substrate area becomes high. As a result, the height variations caused by the capacitive element layer become larger.

SUMMARY OF THE INVENTION

Accordingly, a major object of the present invention is to provide a semiconductor module that a semiconductor device can be stably flip-chip-bonded.

In order to accomplish the aforementioned object, the semiconductor module of the present invention includes a multi-layer substrate, at least four terminal electrodes provided on a surface of the multi-layer substrate, an electric functional layer which is selectively provided at an internal area of the multi-layer substrate placed below all terminal electrodes in a substrate thickness direction and a semiconductor device which is flip-chip-bonded to the terminal electrodes. The position below the terminal electrodes in the substrate thickness direction refers to as a position immediately below the terminal electrodes in the substrate thickness direction and a position in the vicinity thereof.

In accordance with the present invention, as the electric functional layer is selectively provided at the position below all terminal electrodes, the height positions of terminal electrodes coincide with each other. For this reason, a clearance is not generated between the terminal electrode of the multi-layer substrate and an input/output electrode of the semiconductor device. Thus, the both electrodes can be directly contacted and electrically connected to the same. Consequently, the semiconductor device can be stably flip-chip-bonded to the multi-layer substrate.

In accordance with the structure that three or less terminal electrodes are provided, even if the height variations are generated, one flat surface made by connecting connected portions together always exists. In accordance with the structure that four or more terminal electrodes are provided, however, if the height variations are generated, a flat surface made by connecting connected portions cannot be formed. As a result, when the semiconductor device is flip-chip-bonded to the multi-layer substrate in a basic structure of the present invention in which four or more terminal electrodes are provided, a clearance generated between the semiconductor device and the terminal electrode due to the above-described height variations of the terminal electrodes is inevitable. Thus, the structure of the present invention which is capable of suppressing the height variations of the terminal electrodes is significantly effective.

Further, as the input/output electrode of the semiconductor device is connected to the terminal electrode of the multi-layer substrate without a clearance therebetween, the both electrodes can be electrically connected at the distance qualified as the shortest distance. Thus, a reduction in parasitic inductance and an improvement in high frequency characteristic can be accomplished. As a result, the semiconductor module with excellent high frequency characteristic can be structured.

In order to eliminate the height variations of the terminal electrodes, it is considered that one of insulating layers for constituting the multi-layer substrate is substituted by an electric functional layer per insulating material layers. If so, the electric functional layer can be formed within the multi-layer substrate below the semiconductor device, and the height variations of the terminal electrodes can be eliminated. Nevertheless, in accordance with such structure, the electric functional layer is also provided at unnecessary portions within the multi-layer substrate. That causes a crosstalk at a wiring layer within the multi-layer substrate and a floating capacitance, and is not preferable.

In contrast, in accordance with the structure of the invention of the application, the electric functional layer is selectively provided only at the position that an electric functional element is provided, and is not provided at unnecessary portions. Accordingly, the crosstalk at the wiring layer and the floating capacity are not generated.

Further, in accordance with the invention of the application, the parasitic inductance can be reduced due to the following reasons. In order to reduce a parasitic capacitance component which is problematic in the semiconductor module, the electric functional layer (e.g., a capacitive element layer) within the multi-layer substrate must be connected to the semiconductor device at a distance that is as short as possible.

In order to perform the short distance connection, a conductive material (a via hole) is provided at the internal area of the multi-layer substrate placed below the terminal electrode in the substrate thickness direction, and the electric functional layer is preferably electrically connected via the conductive material to the terminal electrode. Further, a length of the conductive material is preferably as short as possible.

In order to shorten the conductive material, the internal area of the substrate that the conductive material is formed needs to be made thin. Nevertheless, the conductive material is placed above the electric functional layer in the substrate thickness direction. For this reason, if the internal area of the substrate that the conductive material is formed is made thin, a ratio of a thickness of the electric functional layer to a total thickness of the substrate area becomes high.

When the substrate is made thin in a conventional structure, height variations between the terminal electrodes caused by the electric functional layer become larger due to the above-described reasons. In contrast, in accordance with the structure of the invention of the application, height positions of terminal electrodes coincide with each other. Thus, even if the substrate area that the conductive material is formed is made thin, height variations of the terminal electrodes are not generated, and the variations do not become larger. Due to such reasons, in accordance with the structure of the invention of the application, the length of conductive material may be shortened, and the parasitic inductance component can be further reduced.

An area that the electric functional layer does not exist is preferably provided at the internal area of the multi-layer substrate placed at the downward position of a central portion of the semiconductor device in the substrate thickness direction. Thus, a degree of freedom of arrangement of electric wiring (including the via hole) for electrically connecting the terminal electrode to the electric functional layer can be improved. As a result, the semiconductor module with more excellent high frequency characteristic can be realized.

Preferably, the terminal electrode is provided at the opposite surfaces of the multi-layer substrate, and the semiconductor device is flip-chip-bonded to the terminal electrodes on the opposite surfaces of the substrate. Thus, each of the semiconductor devices mounted to the opposite surfaces of the multi-layer substrate can be electrically connected to the electric functional layer within the multi-layer substrate at the shortest distance. As a result of a plurality of functions of the semiconductor device being integrated, the semiconductor module with excellent high frequency characteristic can be obtained.

An internal electrode is provided on the opposite surfaces of the electric functional layer in the substrate thickness direction. A longitudinal dimension of the internal electrode is preferably set so as to be smaller than a dimension corresponding to a ¼ wavelength of wavelength of electric signal to be inputted to the semiconductor device. As a result, the following advantages can be obtained. If the longitudinal direction dimension of the internal electrode is larger than a dimension corresponding to a ¼ wavelength of wavelength of electric signal to be inputted to the semiconductor device, apparent impedances on different positions along a length direction of the internal electrode do not coincide with each other. In particular, when the electric functional layer is a capacitive element layer, the capacitive element layer may not act as a bypass condenser. On the other hand, in accordance with the structure that the longitudinal dimension of the internal electrode is set so as to be smaller than a dimension corresponding to a ¼ wavelength of wavelength of electric signal to be inputted to the semiconductor device, the apparent impedances on different positions along the length direction of the internal electrode substantially coincide with each other. Thus, when the electric functional layer is a capacitive element layer, the capacitive element layer fully acts as a bypass condenser.

In order to coincide the apparent impedances of positions on the internal electrode, it is more preferable that the longitudinal direction dimension of the internal electrode is set so as to be smaller than a dimension corresponding to a ⅛ wavelength of wavelength of electric signal to be inputted to the semiconductor device.

In addition, it is preferable that the internal electrode is provided at the opposite surfaces of the electric functional layer in the substrate thickness direction, and the internal electrode is divided into a plurality of parts. Thus, the electric functional layers with different characteristics can be connected to a plurality of terminals within the semiconductor device with the shortest distance. Consequently, a circuit structure which is optimized for each terminal of the semiconductor device can be realized.

In addition, the internal electrode is preferably divided into a plurality of parts along the area that the terminal electrode is not formed. Thus, the terminal electrode does not exist at a position immediately above a division line of the internal electrode. If the terminal electrode exists at the position immediately above the division line, height variations between the terminal electrode on the division line and the terminal electrode at another position are generated. Since the terminal electrode does not exist at the position immediately above the division line of the internal electrode, the height variations of the terminal electrodes caused by the division line can be prevented. Thus, the semiconductor device can be connected to the multi-layer substrate in an extremely stable manner.

In addition, the electric functional layer is preferably provided at a surface portion of the multi-layer substrate. If so, the semiconductor device can be connected to the electric functional layer at a shorter distance, and the semiconductor module with further excellent high frequency characteristic can be realized.

In addition, at least two of a dielectric layer, a resistor layer and a magnetic material layer are preferably provided as the electric functional layer at the same layer within the multi-layer substrate. As a result, a circuit with higher function and excellent high frequency characteristic can be realized within the semiconductor module.

What is more, at least two of the dielectric layer, the resistor layer and the magnetic material layer are preferably provided as the electric functional layer at different layers within the multi-layer substrate. As a result, a circuit element in which materials optimized for the respective layers are used can be formed.

Incidentally, the periphery of the semiconductor device is preferably filled with a mixture containing an inorganic filler and a thermosetting resin composition. More preferably, the inorganic filler contains at least one of alumina, AlN, silicon nitride and beryllia (BeO). As the mixture filled in the periphery of the semiconductor device contains any inorganic filler with high heat conductivity, the semiconductor module with excellent radiating characteristic can be obtained.

In addition, it is preferable that a plurality of semiconductor modules may be provided, a back surface of multi-layer substrate of one semiconductor module is laminated on a surface of the mixture of the other semiconductor module, and a conductive material for electrically connecting terminal electrodes of the respective semiconductor modules in the mixture is provided. As a result, a mounted body made of semiconductor devices with different functions each of which is mounted on the multi-layer substrate including the electric functional layer can be freely laminated in a three-dimensional direction.

Incidentally, at least one of the electric functional layers may be substituted by an insulating layer having the same thickness as that of the electric functional layer.

In addition, it is preferable that an insulating material forming the multi-layer substrate is low-temperature sintered glass ceramics made mainly of a sintered body of inorganic material, and the electric functional layer is a dielectric layer made mainly of lead-based perovskite compound. In a case of the low-temperature sintered glass ceramics, a thermal treatment temperature at a time of manufacturing may be low. Thus, thermal diffusion between the lead perovskite compound of the dielectric layer and the insulating material of the multi-layer substrate can be reduced.

Further, the insulating material forming the multi-layer substrate preferably may be, for example, low-temperature sintered glass ceramics made mainly of sintered body of inorganic material, and the electric functional layer may be a resistor layer made mainly of, e.g., $RuO_2$. In the case of the low-temperature sintered glass ceramics, as a thermal treatment temperature at a time of manufacturing may be low. Thus, thermal diffusion can be reduced between $RuO_2$ of the resistor layer and the insulating material, and the resistor layer can obtain a desired resistor value.

BRIEF DESCRIPTION OF THE DRAWINGS

Other objects of the present invention will be apparent by understanding of embodiments to be described hereinafter and will be recited in the appended claims. Those who are skilled in the art will appreciate a number of advantages that are not described herein by implementing the present invention.

DESCRIPTION OF THE PREFERRED EMBODIMENTS

Hereinafter, preferred embodiments of the present invention will be described with reference to the drawings.

In the present invention, providing an electric functional element below respective terminal electrodes means that the electric functional element is provided in an internal direction of multi-layer substrate. An arrangement posture of multi-layer substrate and semiconductor is not limited to the respective embodiments, and the multi-layer substrate and the semiconductor module may be placed upside-down or may be placed vertically.

First Preferred Embodiment

Figure 1:
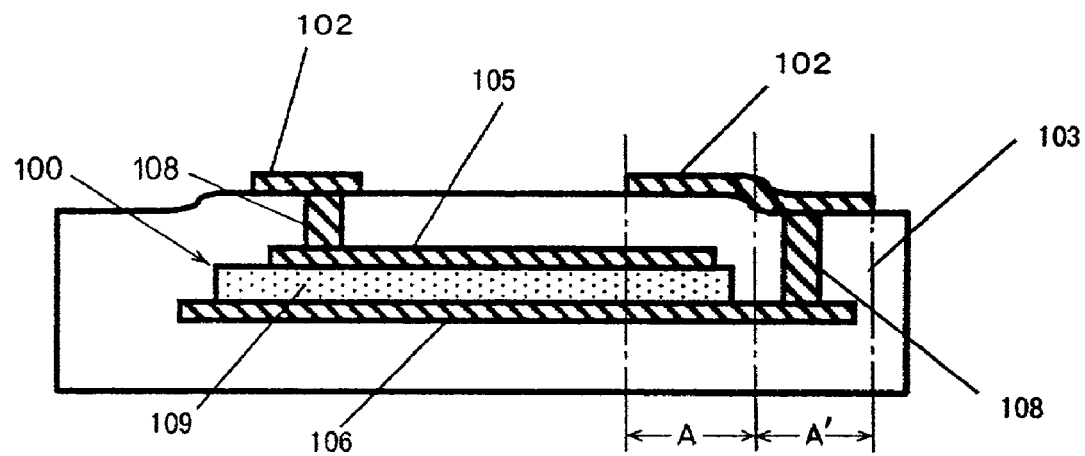
FIG. 1 is a cross-sectional view showing a schematic structure of multi-layer substrate relating to a first preferred embodiment of the present invention.
Figure 2:
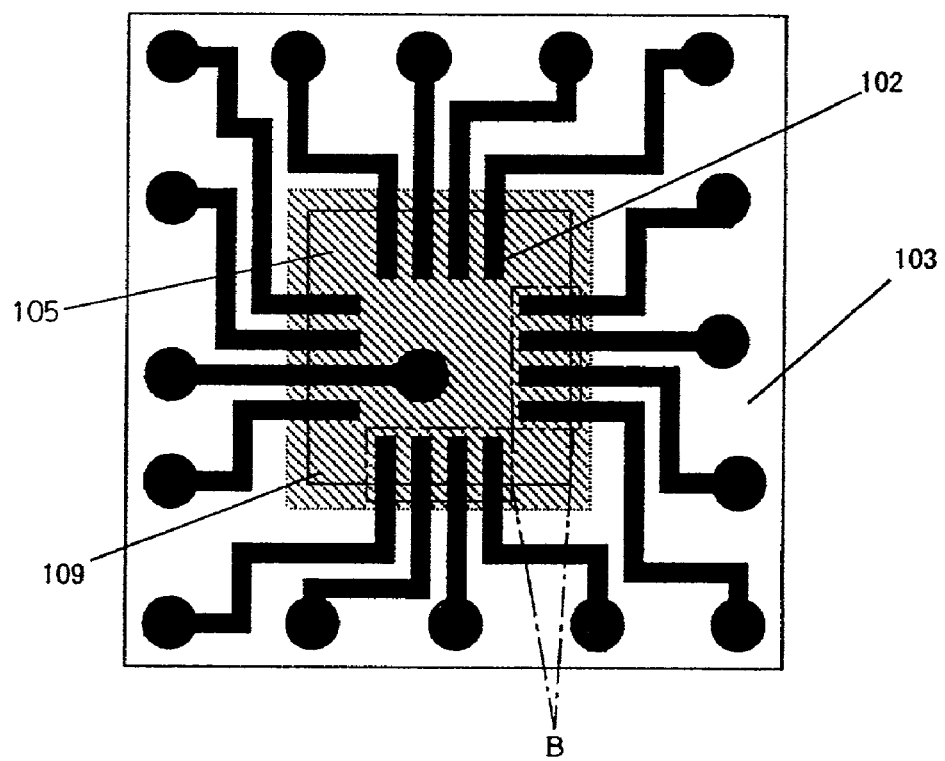
FIG. 2 is a plan view showing a schematic structure of the multi-layer substrate relating to the first preferred embodiment of the present invention.
Figure 3:
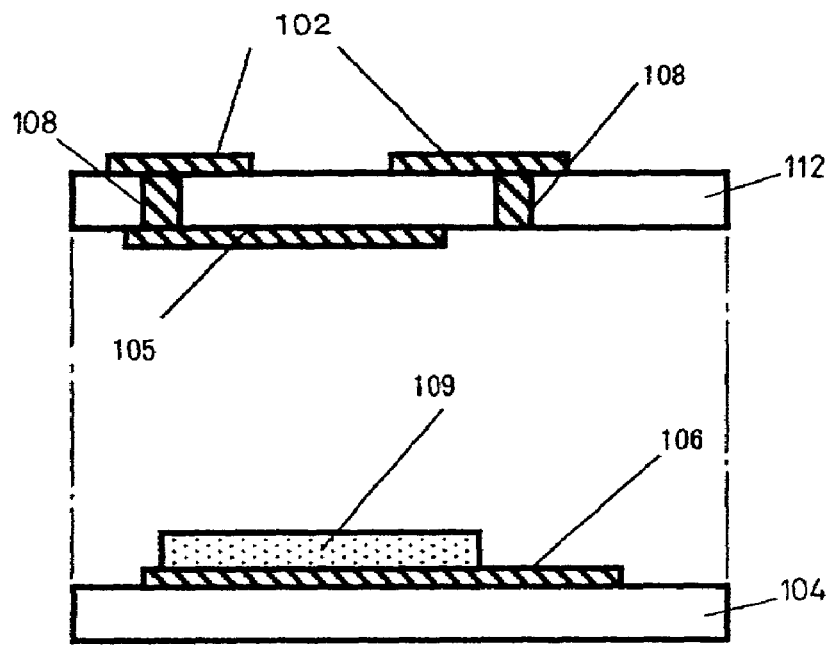
FIG. 3 is a step cross-sectional view showing a schematic manufacturing method of the multi-layer substrate relating to the first preferred embodiment of the present invention.

FIG. 1 is a cross-sectional view of a schematic structure of multi-layer substrate relating to a first preferred embodiment of the present invention. FIG. 2 is a plan view showing the schematic structure of the multi-layer substrate relating to the first preferred embodiment of the present invention. FIG. 3 is a step cross-sectional view showing a schematic manufacturing method of the multi-layer substrate relating to the first preferred embodiment of the present invention.

Hereinafter, a multi-layer substrate relating to the present embodiment will be described with reference to FIGS. 1 and 2. Referring to FIGS. 1 and 2, a reference numeral 102 indicates a terminal electrode. A reference numeral 103 indicates a multi-layer substrate. A reference numeral 105 indicates an upper internal electrode. A reference numeral 106 indicates a lower internal electrode. A reference numeral 108 indicates a conductive material for forming a via hole. A reference numeral 109 indicates a dielectric layer.

The terminal electrode 102 is an electrode connected to a semiconductor device. The terminal electrode 102 is provided on a surface of the multi-layer substrate 103. The upper internal electrode 105, the lower internal electrode 106 and the dielectric layer 109 are provided within the multi-layer substrate 103. The upper internal electrode 105 and the lower internal electrode 106 are disposed so as to sandwich the dielectric layer 109 therebetween in a thickness direction of the dielectric layer 109. Four or more terminal electrodes 102 are provided. In FIG. 2, 16 terminal electrodes 102 are provided. The terminal electrode 102 is connected via the conductive material 108 placed in a thickness direction of the multi-layer substrate 103 to the upper internal electrode 105 and the lower internal electrode 106, respectively.

The dielectric layer 109 is different from an insulating material for forming the multi-layer substrate 103, and is placed below the terminal electrode 102. Namely, as shown in FIG. 2, the dielectric layer 109 is always formed below the terminal electrode 102, and the dielectric layer 109 is not formed at unnecessary areas other than areas the terminal electrodes 102 are formed.

A relative dielectric constant of dielectric material is higher than that of insulating material.

As the dielectric material, for example, lead containing composite perovskite compound based material or barium titanate based material is used. Especially, it is preferable to use the lead containing composite perovskite compound based material due to its larger dielectric constant and relatively low sintering temperature.

Examples of lead based composite perovskite compound include compounds represented by Pb(B1B2)O$_3$ (wherein B1 indicates Co, Mg, Mn or Ni and B2 indicates Nb, Ta or W) and combinations thereof. For example, Pb(Mg1/3Nb2/3)O$_3$—Pb(Ni1/2W1/2)O$_3$—PbTiO$_3$ may be used. Although not especially limited, a thickness of the dielectric layer 109 is usually around 5 μm to 50 μm.

For example, ceramics material such as alumina or glass-ceramics composite material may be used for the insulating material.

In particular, the glass-ceramics composite material is preferably used as the insulating material because it has relatively low sintering temperature and a metal having low melting point such as copper or silver may be used as a conductor. Examples of glass components for forming the glass-ceramics composite material include crystalline glass such as a borosilicate glass containing lead oxide, zinc oxide, alkali metal oxide and alkaline earth metal oxide and a borosilicate glass. A compositional ratio of components in the glass-ceramics composite material may be appropriately adjusted by considering a sintering temperature, a relative dielectric constant and a mechanical strength of the composite material. Although a thickness of the multi-layer substrate (insulating material layer) 103 is not especially limited, the multi-layer substrate 103 usually has a thickness of around 30 μm to 300 μm.

Next, a method of manufacturing the multi-layer substrate will be described with reference to FIG. 3. Firstly, a sheet-shaped insulating material 104 with the lower internal electrode 106 being formed at least at one surface thereof is prepared. The dielectric layer 109 is formed on the sheet-shaped insulating material 104. The dielectric layer 109 is prepared by the following method. Slurry is prepared by mixing powder of lead based perovskite compound with an organic binder. Mixing is performed by using a conventional kneader such as a ball mill or a three-roll. Next, the resultant slurry is printed on the sheet-shaped insulating material 104 with the lower internal electrode 106 being formed thereat. As a result, the dielectric layer 109 is formed on the sheet-shaped insulating material 104.

A green sheet 112 made of low-temperature sintered substrate material which is mainly made of glass and alumina (e.g., MLS-1000™ manufactured by Nippon Electric Glass Co., Ltd. having a thickness of 220 μm) is prepared as a sheet-shaped insulating material. A through-hole with 0.2 mmϕ is formed at the green sheet 112. This through-hole is formed by a hole-making process using a puncher. Then, a conductive paste which is mainly made of silver powder is loaded into the through-hole by a printing method, so that a conductive material 108 is formed.

A wiring pattern including the terminal electrode 102 is printed on one surface of the green sheet 112. A wiring pattern including the upper internal electrode 105 is printed on the other surface of the green sheet 112.

The sheet-shaped insulating material 104 and the green sheet 112 are laminated together so as to sandwich the dielectric layer 109. A resultant laminated body is pressed at a temperature of 70° C. and a pressure of 50 Kg/cm². The laminated body is sintered under conditions set within a range of 850° C. to 950° C. and a range of 0.1 hour to 10 hours. As a result, the multi-layer substrate 103 is manufactured.

In a case of the multi-layer substrate 103 manufactured by the above-described manner, the dielectric layer 109 may be provided at desired area within the multi-layer substrate 103. Namely, as shown in FIG. 2, the dielectric layer 109 is always provided below the terminal electrode 102.

At this time, the multi-layer substrate 103 with the area where the dielectric layer 109 is formed has a larger total thickness than that of the multi-layer substrate 103 with the area where the dielectric layer 109 is not formed. For example, in a case of comparing two areas A and A' with a conductor such as the terminal electrode 102 being formed at surfaces thereof, it is assumed that the dielectric layer 109 has a thickness of 10 μm. The thickness of the multi-layer substrate 103 including the area A where the dielectric layer 109 is formed is larger by 1 μm to 10 μm than that of the area A' that does not have the dielectric layer 109.

Nevertheless, the area where the dielectric layer 109 is provided is formed in a plane surface. Thus, referring to FIG. 2, height variations of the terminal electrodes 102 in the respective areas B that a semiconductor device is connected to are eliminated.

Height variations of the two areas A and A' at their surfaces are varied depending on an amount of shrinkage of dielectric material at a time of manufacturing the multi-layer substrate 103, characteristics of the dielectric material itself and a pressure at a time of pressing. Further, the height variations may vary depending on the presence or absence of the conductive material 108 placed at the upper and the lower portions of the dielectric material.

As a capacity value to be built-in in the dielectric layer 109, when the dielectric layer 109 with a size of 1 mm×1 mm is formed, about 2 nF of capacitive element is built-in.

In accordance with the multi-layer substrate 103 with the above-described structure, the dielectric layer 109 may be selectively formed below the terminal electrodes 102. Thus, height variations of the terminal electrodes 102 to be connected to a semiconductor device can be suppressed. For this reason, a semiconductor device 101 can be stably flip-chip-bonded to the multi-layer substrate 103. As a result, connection inferior can be prevented, and flip chip bonding of semiconductor device with high yield rate can be securely performed.

In the structure of the first embodiment that four or more terminal electrodes 102 are provided, if height variations are generated between the terminal electrodes 102, one flat surface cannot be formed by connecting connected portions of the semiconductor device 101 and the terminal electrodes 102. When the semiconductor device 101 is flip-chip-bonded to the multi-layer substrate 103 relating to the first embodiment, a clearance might be formed between the semiconductor device 101 and the terminal electrode 102 due to the above-described height variations of the terminal electrodes.

In contrast, in the present embodiment, the height variations of the terminal electrodes 102 are suppressed. For this reason, even in the structure that four or more terminal electrodes 102 are formed, a clearance is not generated between the semiconductor 101 and the terminal electrode 102. Thus, the semiconductor device 101 can be stably flip-chip-bonded to the multi-layer substrate 103.

An electric functional element (capacitive element) 100 is formed below the terminal electrodes 102. Thus, the capacitive element is placed at a position that is considered to have substantially the shortest distance to the terminal electrode 102 within the multi-layer substrate 103. Consequently, an impedance becomes small, resulting in a multi-layer substrate with excellent high frequency characteristic.

Second Preferred Embodiment

Figure 4:
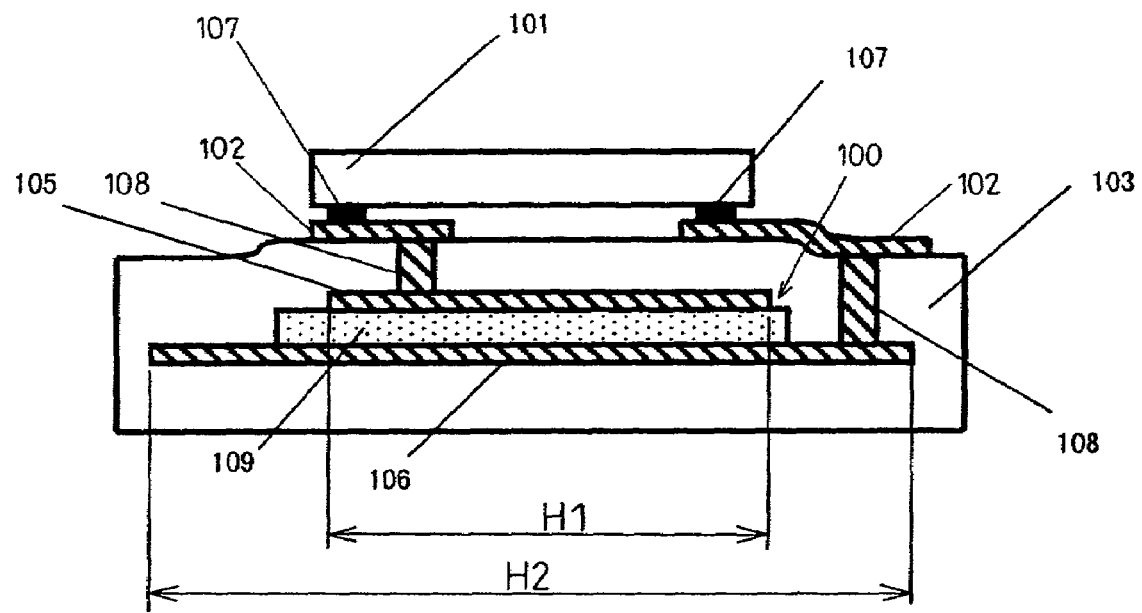
FIG. 4 is a cross-sectional view showing a schematic structure of semiconductor module relating to a second preferred embodiment of the present invention.

FIG. 4 is a cross-sectional view showing a schematic structure of semiconductor module relating to a second preferred embodiment of the present invention. FIG. 5 is a step cross-sectional view showing a schematic manufacturing method of the semiconductor module relating to the second preferred embodiment.

The present embodiment has the multi-layer substrate 103 of the first preferred embodiment. The multi-layer substrate 103 has the same structure as in the first preferred embodiment. Thus, the description of the multi-layer substrate 103 will be omitted.

A bump electrode 107 is provided at an active surface of a semiconductor device 101. The semiconductor device 101 is disposed such that its active surface faces the multi-layer substrate 103. The bump electrode 107 is electrically connected to the terminal electrode 102. Thus, the semiconductor device 101 is flip-chip-bonded to the multi-layer substrate 103.

In a semiconductor module with such structure, a dielectric layer 109 is disposed at an internal area of the multi-layer substrate 103 disposed below the semiconductor device 101. For this reason, little height variations of the terminal electrodes 102 to be connected to the semiconductor device 101 are generated.

A method of flip-chip-bonding the semiconductor device 101 to the multi-layer substrate 103 with such structural characteristics is as follows.

Figure 5A:
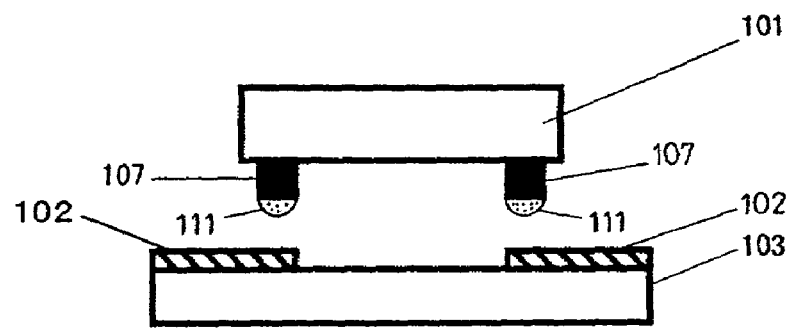
FIGS. 5A to 5C are step cross-sectional views showing a schematic manufacturing method of the semiconductor module relating to the second preferred embodiment of the present invention.

Namely, as shown in FIG. 5A, bump electrodes 107 made of Au or the like are formed on input/output terminals (not shown) of the semiconductor device 101 by a wire bonding method or a plating method. A conductive adhesive 111 prepared by dispersing particulates of gold, silver or silver-palladium alloy flakes in a resin is provided. The conductive adhesive 111 is applied to each of the bump electrodes 107.

Figure 5B:
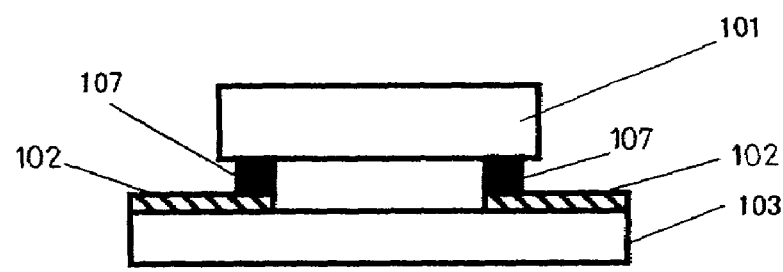

Next, as shown in FIG. 5B, the semiconductor 101 is positioned with respect to the multi-layer substrate 103 such that the conductive adhesive 111 attaches to the terminal electrodes 102. Then, the conductive adhesive 111 is cured at this state. Thus, the bump electrode 107 is electrically connected via the conductive adhesive 111 to the terminal electrode 102. In addition to noble metals, a metal for forming the bump electrode 107 may be a solder. When the solder is used for forming the bump electrode 107, the bump electrode 107 can be made by melting the solder. Further, if the bump electrode 107 is made of solder, the conductive adhesive may also be used for electric connection between the bump electrode 107 and the terminal electrode 102.

Figure 5C:
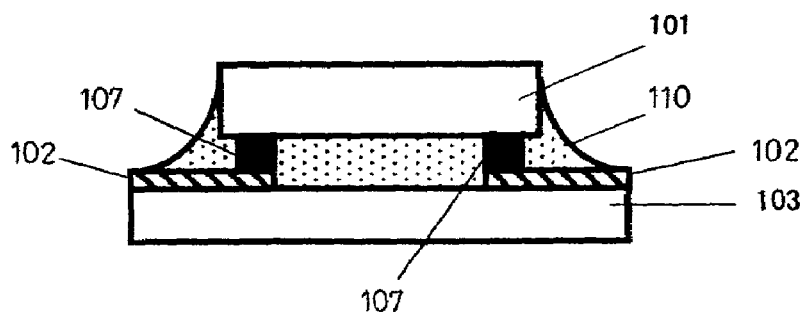

As shown in FIG. 5C, in order to strengthen the connection between the semiconductor 101 and the multi-layer substrate 103, a liquid resin composition 110 is loaded into a space formed between the semiconductor device 101 and the multi-layer substrate 103 and then cured. In this way, this space is sealed. In this case, the resin composition 110 containing an epoxy based resin and a filler such as silica may be used. Preferably, the filler is uniformly dispersed within the resin composition 110.

Height variations of the bump electrodes 107 may cause connection inferior when the terminal electrodes 102 are electrically connected to the bump electrodes 107. If the conductive adhesive 111 is applied, however, it acts so as to absorb the height variations between the bump electrodes 107 and the terminal electrodes 102.

The conductive adhesive 111 has usually a thickness of about 10 μm. If an amount of the height variations of the bump electrodes 107 is smaller than the thickness of the conductive adhesive 111, the aforementioned connection inferior does not occur, and the bump electrodes 107 can be electrically connected to the terminal electrodes 102 in a stable manner.

In other words, this means that if unevenness of a surface of the substrate is equal to or less than 10 μm, the bump electrode 107 can be electrically connected to the terminal electrode 102 in a stable manner.

The multi-layer substrate 103 is structured such that the height variations of the terminal electrodes 102 are seldom generated. Accordingly, the unevenness of the surface of the multi-layer substrate 103 is equal to or less than 10 μm. Thus, when the semiconductor device 101 is flip-chip-bonded to the multi-layer substrate 103 with the above-described structure, a bonding condition is stable. As a result, a semiconductor device with high yield rate can be obtained.

In the structure of the second embodiment that four or more terminal electrodes 102 are provided, if height variations are generated between the terminal electrodes 102, one flat surface cannot be formed by connecting connected portions of the semiconductor device 101 and the terminal electrodes 102. When the semiconductor device 101 is flip-chip-bonded to the multi-layer substrate 103 relating to the second embodiment, a clearance might be formed between the semiconductor device 101 and the terminal electrode 102 due to the above-described height variations of the terminal electrodes.

In contrast, in the present embodiment, the height variations of the terminal electrodes 102 are suppressed. For this reason, even in the structure that four or more terminal electrodes 102 are formed, a clearance is not generated between the semiconductor 101 and the terminal electrode 102. Thus, the semiconductor device 101 can be stably flip-chip-bonded to the multi-layer substrate 103.

An electric functional element 100 serving as a capacitive element is formed below the terminal electrodes 102. Thus, the capacitive element is placed at a position that is considered to have substantially the shortest distance to the terminal electrode 102. Consequently, an impedance becomes small, and high frequency characteristic is improved.

In addition to the above-described structure, the present embodiment includes the following structure. Namely, a longitudinal direction dimension H1 of the upper internal electrode 105 and a longitudinal direction dimension H2 of the lower internal electrode 106 are set as follows.

These longitudinal direction dimensions H1 and H2 are set so as to be smaller than a dimension corresponding to a ¼ wavelength of wavelength of electric signal to be inputted to the semiconductor device 101.

Due to the longitudinal direction dimensions H1 and H2 of the upper and the lower internal electrodes 105 and 106 being set as described above, the following effects are exhibited. Namely, if the longitudinal direction dimension H1 of the upper internal electrode 105 and the longitudinal direction dimension H2 of the lower internal electrode 106 are larger than a dimension corresponding to a quarter wavelength of wavelength of electric signal inputted to the semiconductor device 101, apparent impedances on different positions along the length directions of the internal electrodes 105 and 106 do not coincide with each other. Then, a capacitive element layer formed by the dielectric layer 109 may not act as a bypass condenser. In contrast, in the structure of the second embodiment in which the longitudinal dimensions of the internal electrodes 105 and 106 are smaller than a dimension corresponding to a quarter wavelength of the wavelength of the electric signal to be inputted to the semiconductor device 101, apparent impedances on different positions along the length directions of the internal electrodes 105 and 106 almost coincide with each other. Thus, the capacitive element layer formed by the dielectric layer 109 can fully act as a bypass condenser.

In order to precisely coincide the apparent impedance on the respective positions of the internal electrodes 105 and 106 with each other, the longitudinal dimensions H1 and H2 are preferably smaller than a dimension corresponding to a ⅛ wavelength of the wavelength of the electric signal.

For example, if an electric signal of 10 GHz is inputted to the semiconductor device 101, a wavelength of the electric signal is 10.0 mm. For this reason, the longitudinal direction dimensions H1 and H2 are set to be equal to or smaller than 10/4=2.5 mm. More preferably, the longitudinal direction dimensions H1 and H2 are set to be equal to or smaller than 10/8=1.25 mm.

Although the case in which the electric functional element 100 is a capacitive element is shown in the first and second embodiments, the present invention is not limited to this case. For example, instead of the capacitive element, the electric functional element 100 may be formed by an inductor or a resistive element.

The multi-layer substrate 103 which houses an inductor as the electric functional element 100 is provided with a magnetic material layer instead of the dielectric layer 109. In this case, this multi-layer substrate 103 has the same structure as that of the above-described multi-layer substrate 103 that the capacitive element is built-in except that positions of the internal electrodes 105 and 106 and a shape thereof are different a little.

The magnetic material layer is not especially limited, and conventionally known magnetic materials for inductor may be appropriately selected depending on a sintering temperature, a permeability, a magnetic loss and a temperature characteristic. Examples of the magnetic material layer include NiZnCu-based, NiZn-based, MnZn-based and MgZn-based spinel ferrites and garnet ferrites. In particular, NiZnCu-based spinel ferrite is useful as the magnetic material layer due to its large electric resistivity and relatively low sintering temperature.

The same materials as the materials for the internal electrodes 105 and 106 of the multi-layer substrate 103 housing the capacitive element may be used for the internal electrodes 105 and 106. The shape of the internal electrodes such as a linear shape, a spiral shape and a meander shape may be selected in accordance with applications.

Third Preferred Embodiment

Figure 6:
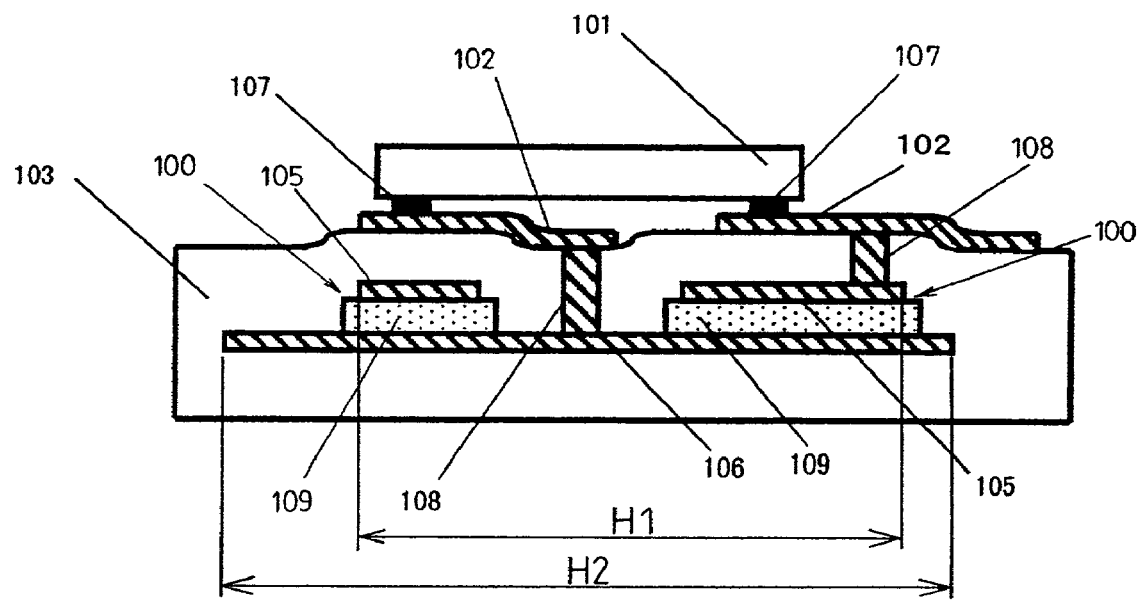
FIG. 6 is a cross-sectional view of a schematic structure of semiconductor module relating to a third preferred embodiment of the present invention.
Figure 7:
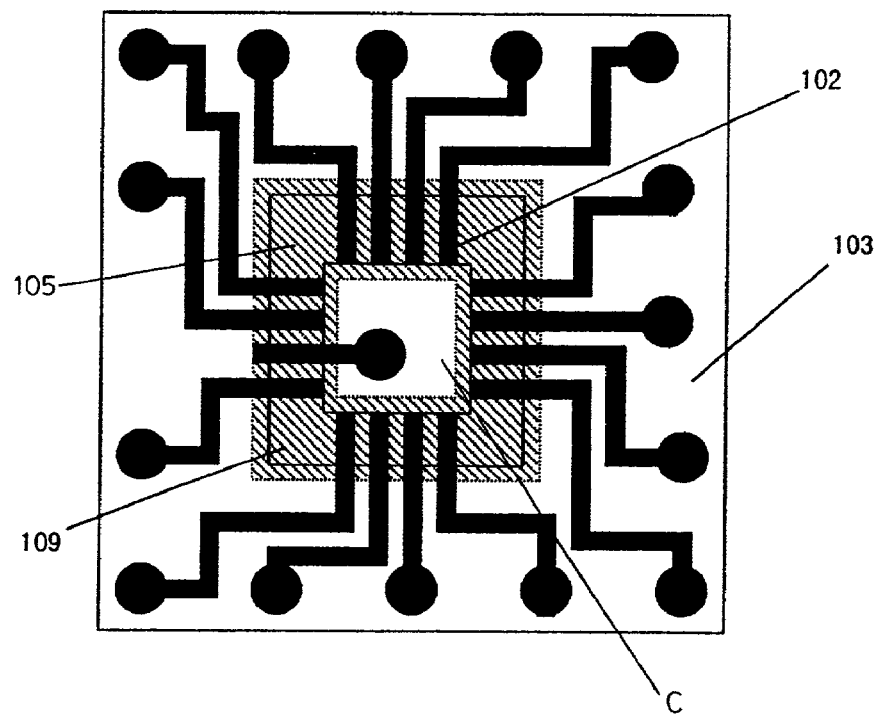
FIG. 7 is a plan view showing a schematic structure of the semiconductor module relating to the third preferred embodiment of the present invention.

FIG. 6 is a cross-sectional view of a schematic structure of semiconductor module relating to a third preferred embodiment of the present invention. FIG. 7 is a plan view of the schematic structure of the semiconductor module relating to the third preferred embodiment of the present invention.

In the above-described second preferred embodiment, the dielectric layer 109 is formed at the internal area of the multi-layer substrate 103 placed below the semiconductor device 101 in a substrate thickness direction. In the third embodiment, the dielectric layer 109 is selectively formed only at downward positions of all of the terminal electrodes (four or more terminal electrodes are provided) 102 connected via the bump electrodes 107 of the semiconductor device 101 in a substrate thickness direction. Further, the dielectric layer 109 is formed in a rectangular frame shape. As a result, an area C that the dielectric layer 109 is not formed is provided below a central portion of the semiconductor device 101 in the substrate thickness direction. Consequently, a wiring (a conductive material 10) may be disposed without being restricted by formation of the capacitive element. For example, the terminal electrode 102 can be connected via the conductive material 108 to the wiring at an inner layer at a downward position of the semiconductor device 101 in the substrate thickness direction. In particular, the terminal electrode 102 can be electrically connected via the conductive material 108 to the lower internal electrode 106 at the downward position of the semiconductor device 101 in the substrate thickness direction. Thus, a degree of freedom in a wiring design is increased.

In accordance with this semiconductor module, as the above-described first and second embodiments, height variations of the terminal electrodes 102 can be suppressed. For this reason, the multi-layer substrate 103 can be stably flip-chip-connected to the semiconductor device 101. Thus, the semiconductor module with high yield rate can be obtained.

Further, as the electric functional element (capacitive element) 100 is formed at the downward position of the terminal electrode 102 in the substrate thickness direction, an impedance becomes small due to the same reasons as in the above-described embodiments 1 and 2. As a result, the semiconductor module with excellent high frequency characteristic can be obtained.

In the present embodiment, the example in which the dielectric layer 109 constituting the capacitive element is provided below the terminal electrode 102 except for the position (i.e., the area C) below the central portion of the semiconductor device 101 in the substrate thickness direction. Nevertheless, the position of the area C that the dielectric layer 109 is not formed is not limited to the position below the central portion of the semiconductor device 101, and may be any area other than the position below the terminal electrode 102.

Also, in the present embodiment, a longitudinal direction dimension H1 of the upper internal electrode 105 and a longitudinal direction dimension H2 of the lower internal electrode 106 are set as follows. Namely, the longitudinal direction dimensions H1 and H2 are set so as to be smaller than a dimension corresponding to a ¼ wavelength (preferably, a dimension corresponding to a ⅛ wavelength) of wavelength of electric signal to be inputted to the semiconductor device 101. Thus, apparent impedances on different positions along the length directions of the internal electrodes 105 and 106 substantially coincide with each other. Consequently, the capacitive element layer formed by the dielectric layer 109 can fully act as a bypass condenser.

The electric functional element 100 is not limited to the capacitive element, and may be an inductor or a resistive element.

Fourth Preferred Embodiment

Figure 8:
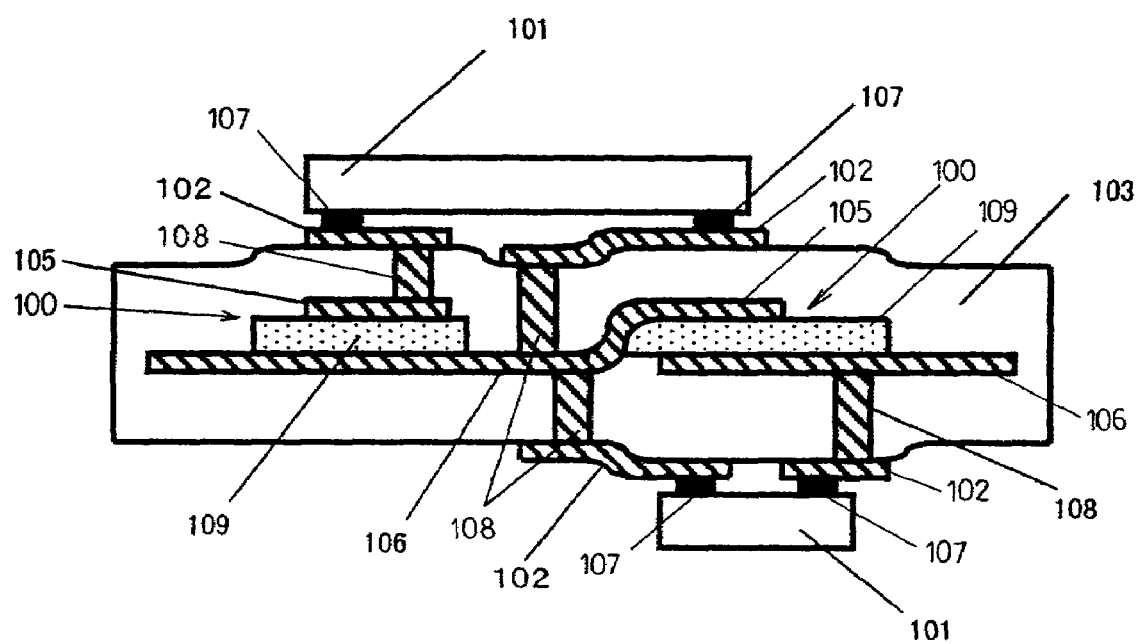
FIG. 8 is a cross-sectional view showing a schematic structure of semiconductor module relating to a fourth preferred embodiment of the present invention.

FIG. 8 is a cross-sectional view showing a schematic structure of semiconductor module relating to a fourth preferred embodiment of the present invention. FIG. 9 is a step cross-sectional view of a schematic manufacturing method of the semiconductor module relating to the fourth preferred embodiment of the present invention.

In accordance with the third preferred embodiment, at least one semiconductor device 101 is flip-chip-bonded to one surface of the multi-layer substrate 103. In contrast, in accordance with the fourth embodiment, at least one semiconductor device 101 is flip-chip-bonded to each of both surfaces of the multi-layer substrate 103.

The dielectric layer 109 is provided at the position below the terminal electrode 102 to be electrically connected to each of the semiconductor devices 101 in the substrate thickness direction.

The semiconductor module relating to the present embodiment is manufactured as shown in the step cross-sectional view shown in FIG. 9.

Figure 9A:
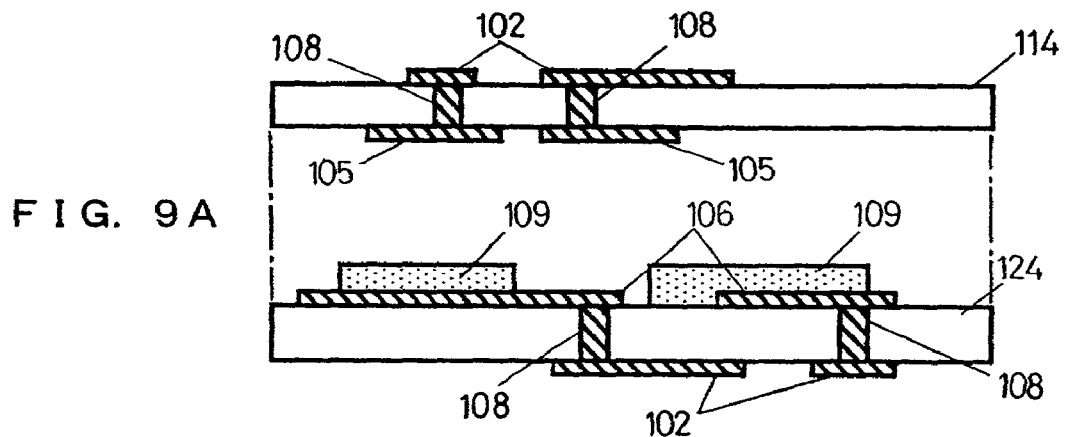
FIGS. 9A to 9D are step cross-sectional views showing a schematic manufacturing method of the semiconductor module relating to the fourth preferred embodiment of the present invention.

Firstly, as shown in FIG. 9A, a through-hole is formed at a lower sheet-shaped insulating material 124. The through-hole is formed by a hole-making process using, e.g., a puncher. A conductive paste made of mainly silver powder is loaded into the formed through-hole by a printing method. In this way, the conductive material 108 is formed. A wiring pattern including the terminal electrode 102 is printed on a lower surface of the lower sheet-shaped insulating material 124 with the conductive material 108 being formed thereat. A wiring pattern including the lower internal electrode 106 is printed on a upper surface of the lower sheet-shaped insulating material 124. The dielectric layer 109 is formed on the upper surface of the lower sheet-shaped insulating material 124 by a printing method or the like.

A through-hole is formed at the upper sheet-shaped insulating material 114 by the same manner as the above-described manner. Further, a conductive paste is loaded into the formed through-hole. Thus, the conductive material 108 is formed. A wiring pattern including the terminal electrode 102 is printed on an upper surface of the upper sheet-shaped insulating material 114. The upper internal electrode 105 is formed on a lower surface of the upper sheet-shaped insulating material 114.

Figure 9B:
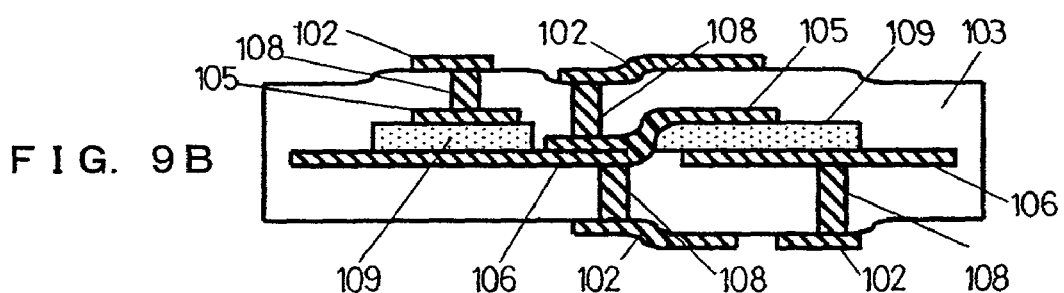

Next, as shown in FIG. 9B, the upper sheet-shaped insulating material 114 and the lower sheet-shaped insulating material 124 are laminated and integrated by heating and pressing such that the dielectric layer 109 is sandwiched between the upper internal electrode 105 and the lower internal electrode 106. The manufactured laminated body is culcinated. At this time, the dielectric layer 109 is formed at the downward position of the terminal electrode 102 formed on the upper sheet-shaped insulating material 114 in the substrate thickness direction. At the same time, the dielectric layer 109 is also formed at the downward position of the terminal electrode 102 formed on the lower sheet-shaped insulating material 124.

Figure 9C:
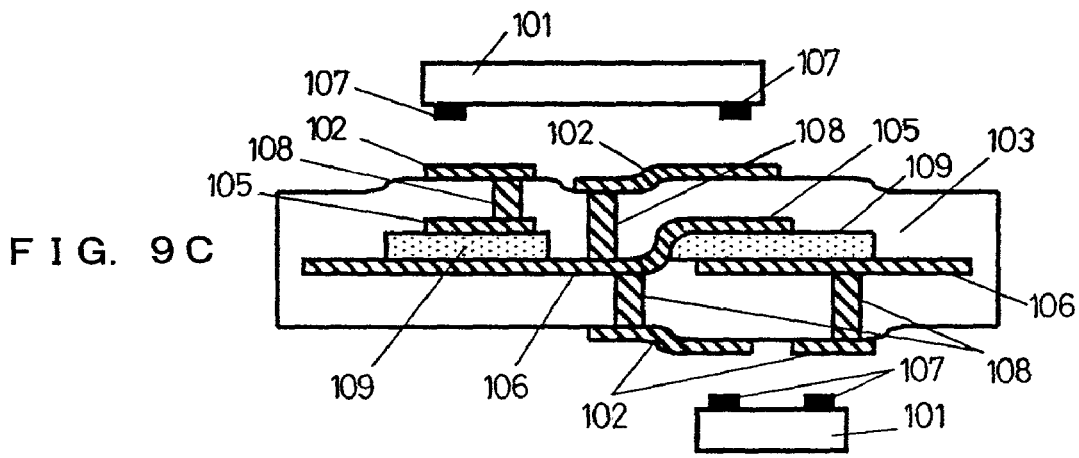

Further, as shown in FIG. 9C, the terminal electrodes 102 on the upper and the lower surface of the multi-layer substrate 103 are positioned with respect to each of the semiconductor devices 101. Specifically, the bump electrodes 107 of the semiconductor devices 101 are positioned with respect to the terminal electrodes 102.

Figure 9D:
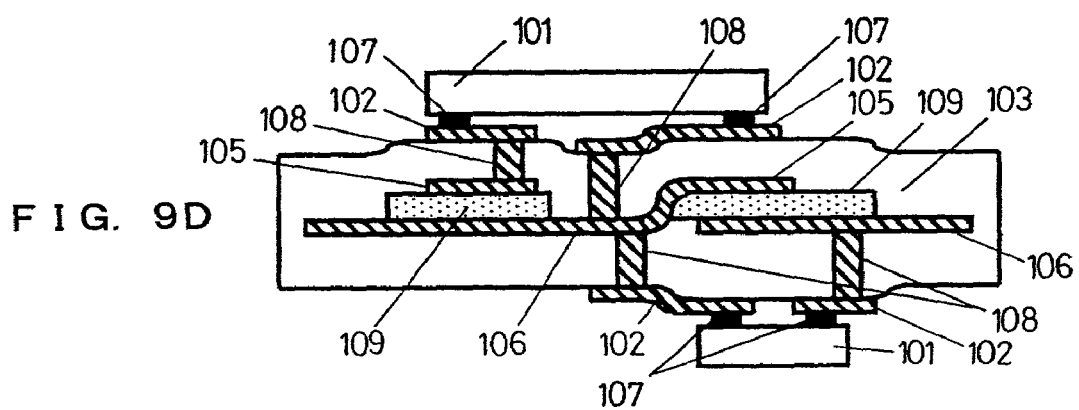

Thereafter, as shown in FIG. 9D, the semiconductor devices 101 are flip-chip-bonded to the upper surface and the lower surface of the multi-layer substrate 103, respectively. In this way, the semiconductor module in which semiconductor devices 101 are mounted on opposite surfaces of the multi-layer substrate 103 is completed.

In accordance with the semiconductor module manufactured by the above-described method, the dielectric layer 109 constituting the electric functional element 100 is provided at a desired area within the multi-layer substrate 103. As shown in FIG. 8, the dielectric layer 109 is always formed at the downward position of the terminal electrode 102 for connecting to the semiconductor device 101 in the substrate thickness direction. For this reason, height variations of the terminal electrodes 102 seldom occur. Thus, the semiconductor device 101 can be electrically connected to the multi-layer substrate 103 in a stable manner. The semiconductor module with high yield rate can be obtained thereby.

Further, the semiconductor device 101 and the electric functional element 100 can be connected together at the shortest connection distance. Thus, the electric functional element 100 serving as the capacitive element can act as a bypass condenser for power supply that seldom includes parasitic inductance of unnecessary wirings. The bypass condenser for power supply is connected, for example, to a power supply terminal of the semiconductor device 101.

Figure 10A:
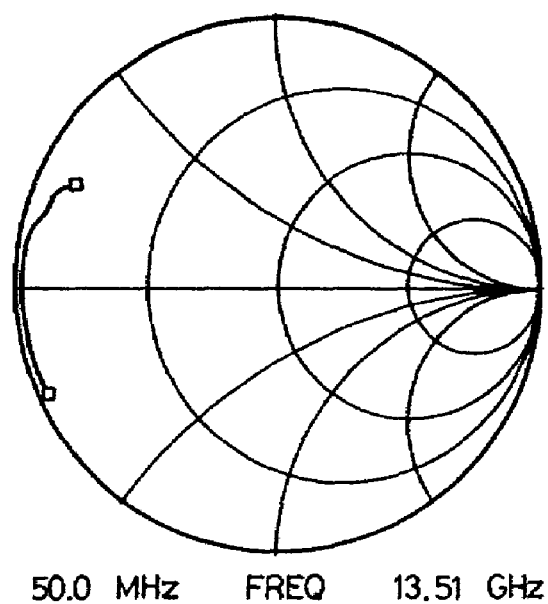
FIG. 10A is a Smith chart showing an impedance of power supply terminal of the semiconductor module relating to the fourth preferred embodiment of the present invention.
Figure 10B:
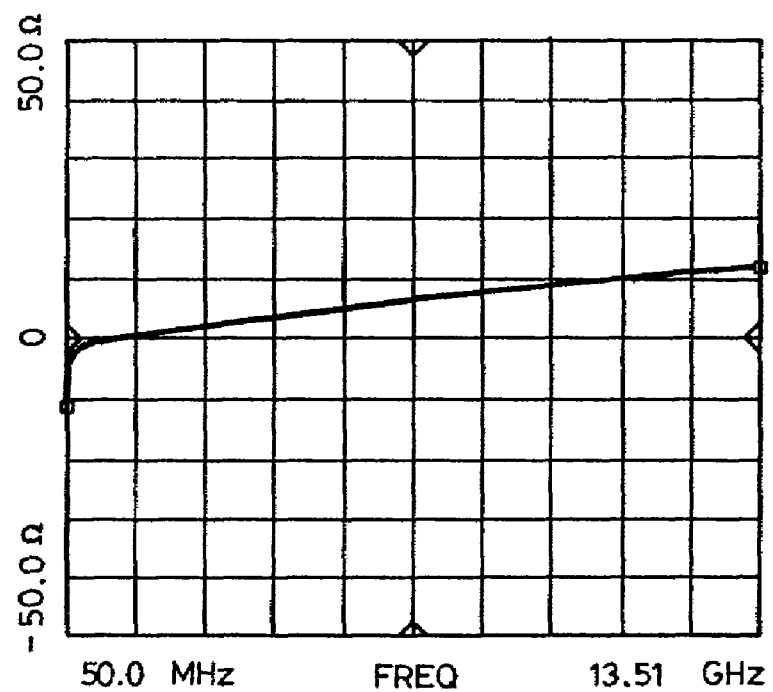
FIG. 10B is a graph showing a frequency characteristic of reactance component of the power supply terminal of the semiconductor module relating to the fourth preferred embodiment of the present invention.

The multi-layer substrate 103 including about 200 pF of capacitive element serving as a bypass condenser connected to a power supply terminal of the semiconductor device 100 was manufactured. Then, characteristics of the resultant multi-layer substrate 103 were measured in a range of 50 MHz to 13.5 GHz. Measurement results are shown in FIGS. 10A and 10B. FIG. 10A shows a Smith chart of reflection characteristic, and FIG. 10B shows reactance components of the reflection characteristic.

An impedance of about 10Ω or less is shown at 10 GHz. It is confirmed that an ideal power supply characteristic can be obtained in a high frequency band.

In the present embodiment, a plurality of semiconductor devices 101 can be mounted to the multi-layer substrate 103. The same type of semiconductor for high frequency such as gallium arsenide may be used as a plurality of semiconductor devices 101. Thus, the semiconductor device module in which an impedance of power supply terminal is stable at high frequency can be obtained.

The same effect can be obtained in combinations of a light receiving element such as a PIN photodiode or an avalanche photodiode for high speed optical communication and an amplification element or of a light emitting element such as a laser diode and a driving element. Thus, it is understood that the semiconductor module with excellent high frequency characteristic is realized. Further, as a power supply impedance which is stable at a time of high speed operation can be obtained, a stable operation in a high speed signal processing is possible in a semiconductor device mainly made of silicon that a logic circuit or a memory circuit for high speed signal processing is built-in.

The electric functional element 100 to be built-in is not limited to the capacitive element, and an inductance or a resistive element may be built-in.

Fifth Preferred Embodiment

Figure 11:
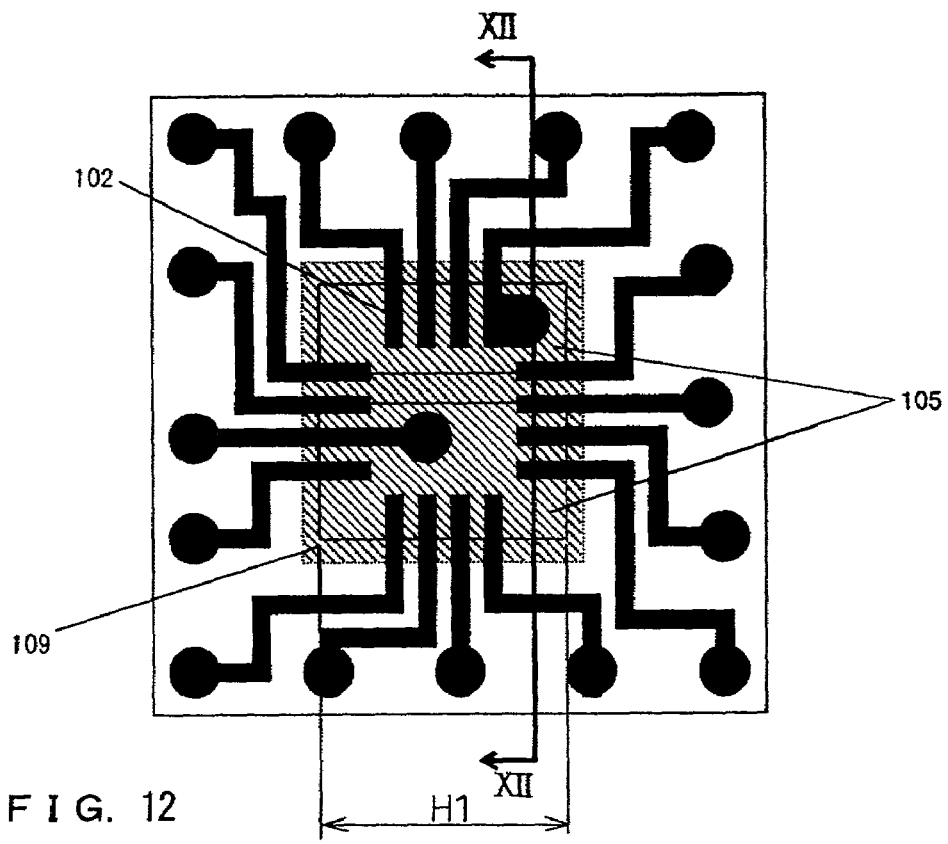
FIG. 11 is a plan view showing a schematic structure of semiconductor module relating to a fifth preferred embodiment of the present invention.
Figure 12:
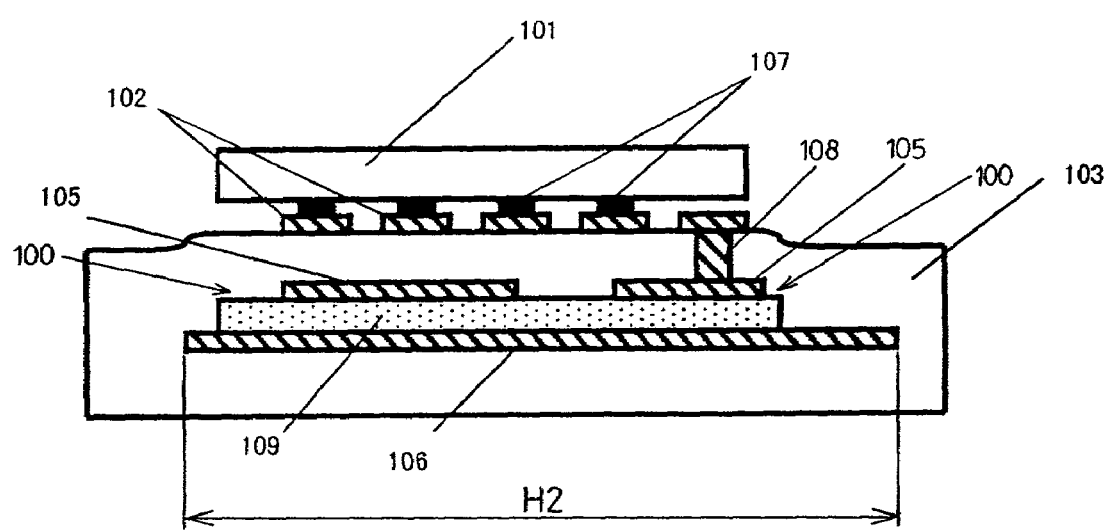
FIG. 12 is a cross-sectional view of FIG. 11 along XII-XII.

FIG. 11 is a plan view showing a schematic structure of semiconductor module relating to a fifth preferred embodiment of the present invention. FIG. 12 is a cross-sectional view of FIG. 11 along a line XII-XII.

In accordance with the semiconductor module of the present embodiment, the upper internal electrode 105 formed within the multi-layer substrate 103 is divided.

The example in which the upper internal electrode 105 is divided into two is shown in FIGS. 11 and 12. When the capacitive element is built-in as a bypass condenser, however, the number the upper internal electrode 105 is divided into is desirably set depending on the number of power supply terminals for high frequency in the semiconductor device 101.

For example, when the dielectric layer 109 made of material having a relative dielectric constant of 4000 is formed to a thickness of 30 μm, the electrode is made at a size of 0.95 mm×0.95 mm, so that about 1000 pF of capacitance value can be obtained. When the semiconductor device 101 with a size of 2 mm×2 mm is used, four capacitive elements each of which has about 1000 pF can be placed immediately below the semiconductor device 101. Thus, four types of capacitive elements corresponding to power supply terminals having different voltage values can be provided. The capacity value can be arbitrarily controlled depending on materials for the dielectric layer 109, thickness of the dielectric layer 109 and dimension of the electrode. By shaping the electrode freely, the capacitive element with a capacity value which is different for each terminal can be formed.

In accordance with the semiconductor module with the above-described structure, as in the above-described embodiments, the height variations of the terminal electrodes 102 are eliminated, and the multi-layer substrate 103 can be stably flip-chip-connected to the semiconductor device 101. Further, because the electric functional element 100 serving as the capacitive element is formed immediately below the terminal electrode 102, the semiconductor module with excellent high frequency characteristic can be obtained.

Also, in the present embodiment, the longitudinal direction dimension H1 of the upper internal electrode 105 and the longitudinal direction dimension H2 of the lower internal electrode 106 are set as follows. Namely, the longitudinal direction dimensions H1 and H2 are set so as to be smaller than a dimension corresponding to a ¼ wavelength (preferably, a dimension corresponding to a ⅛ wavelength) of wavelength of electric signal to be inputted to the semiconductor device 101. Thus, apparent impedances on different positions along the length directions of the internal electrodes 105 and 106 substantially coincide with each other. For this reason, the capacitive element layer formed by the dielectric layer 109 fully acts as a bypass condenser.

Further, in accordance with the present embodiment, terminal electrodes 102 for connecting to the semiconductor device 101 can be connected to the electric functional elements 100 with different characteristics at the shortest distance. Accordingly, even if voltage values of the terminal electrodes 102 of the semiconductor device 101 are different, each of the terminal electrodes 102 is electrically connected to the electric functional element 100 having a capacity corresponding to the voltage value. As a result, a circuit structure which is optimized for each terminal electrode 102 of the semiconductor device 101 can be realized.

The structure of the present embodiment may be applied to the case in which the semiconductor device 101 is mounted on the opposite surfaces of the multi-layer substrate 103, as in the fourth embodiment.

The electric functional element 100 is not limited to the capacitive element, and an inductor or a resistive element may be built-in.

Sixth Preferred Embodiment

Figure 13:
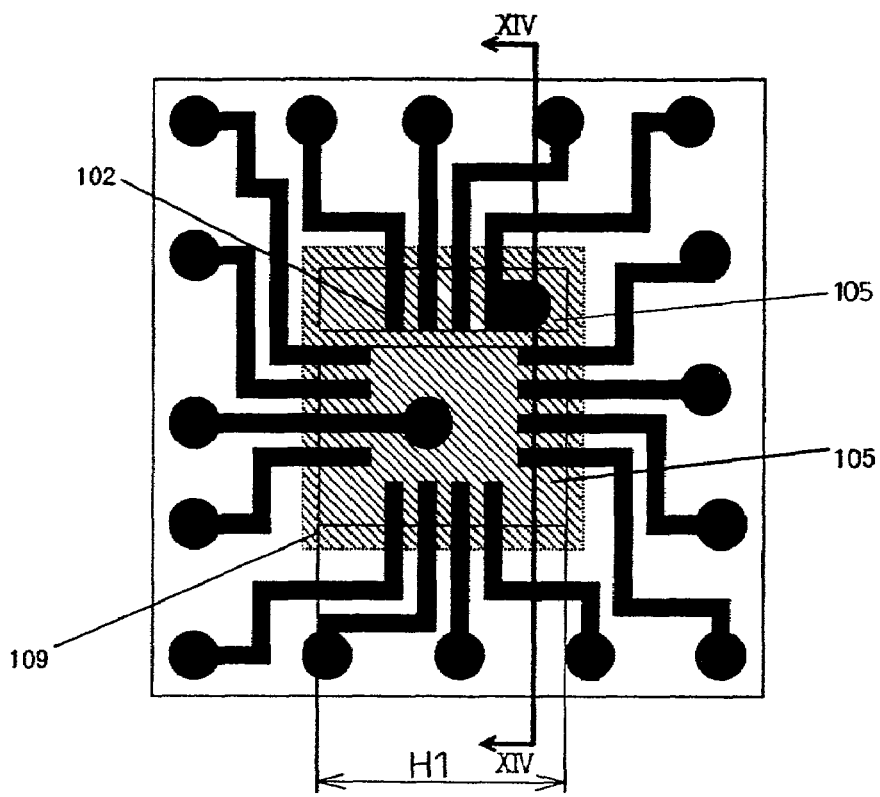
FIG. 13 is a plan view of a schematic structure of semiconductor module relating to a sixth preferred embodiment of the present invention.
Figure 14:
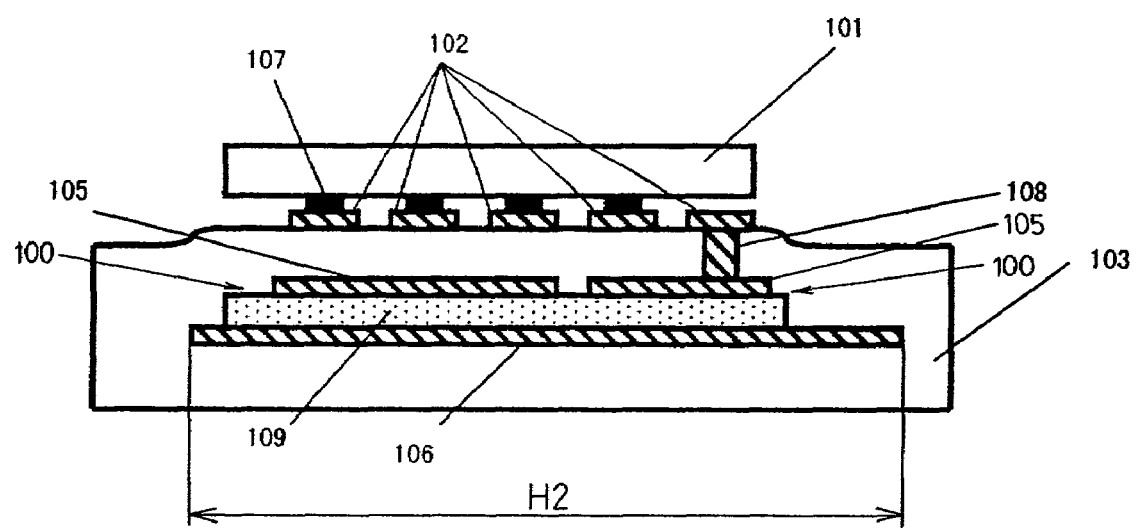
FIG. 14 is a cross-sectional view of FIG. 13 along XIV-XIV.

FIG. 13 is a plan view of a schematic structure of semiconductor device relating to a present preferred embodiment of the present invention. FIG. 14 is a cross-sectional view of FIG. 13 along a line XIV-XIV.

The semiconductor module relating to the sixth embodiment has a first characteristic in that the upper internal electrode 105 provided so as to contact the dielectric layer 109 which is formed within the multi-layer substrate 103 is divided. Further, the semiconductor module has a second characteristic in that the divided upper internal electrodes 105 are provided at downward positions of the terminal electrode 102 in the substrate thickness direction. Namely, the upper internal electrode 105 is formed such that the terminal electrodes 102 do not extend off from the area the upper internal electrode 105 is formed.

In accordance with the semiconductor module with such structure relating to the sixth embodiment, in addiction that the same effects as in the above-described preferred embodiments can be obtained, the following effects can be obtained.

The case in which electrodes having a thickness of less than 10 μm are formed as the upper and the lower internal electrodes 105 and 106 does not present problems. Nevertheless, when the internal electrodes 105 and 106 having a thickness 10 μm or more are formed in order to reduce the resistive components of these internal electrodes 105 and 106, unevenness is generated on the surface of the multi-layer substrate 103 depending on the presence or absence of the internal electrodes 105 and 106 formed within the multi-layer substrate 103. Accordingly, unevenness depending on the presence or absence of the internal electrodes 105 and 106 is also generated within the surface at which the terminal electrodes 102 are formed. Thus, at a time of flip-chip-bonding the semiconductor device 101, a distance between the bump electrodes 107 and the terminal electrodes 102 is not uniform resulting in a decrease in stability of electric connection between the semiconductor device 101 and the multi-layer substrate 103.

On the other hand, in accordance with the sixth embodiment, as the terminal electrode 102 is not provided at an area at which the upper internal electrode 105 is divided, unevenness of the multi-layer substrate 103 at the area that the terminal electrode 102 is formed can be suppressed. Thus, the semiconductor device 101 can be electrically connected to the multi-layer substrate 103 in a significant stable manner, and the electric connection between the semiconductor device 101 and the multi-layer substrate 103 becomes more reliable.

Also, in accordance with the present embodiment, the longitudinal direction dimension H1 of the upper internal electrode 105 and the longitudinal direction dimension H2 of the lower internal electrode 106 are set as follows.

Namely, the longitudinal direction dimensions H1 and H2 are set so as to be smaller than a dimension corresponding to a ¼ wavelength (preferably, a dimension corresponding to a ⅛ wavelength) of wavelength of electric signal to be inputted to the semiconductor device 101. Thus, apparent impedances on different positions along the length directions of the internal electrodes 105 and 106 substantially coincide with each other. For this reason, the capacitive element layer formed by the dielectric layer 109 fully acts as a bypass condenser.

The structure of the present embodiment may be applied to the case in which the semiconductor device 101 is mounted on the opposite surfaces of the multi-layer substrate 103, as in the fourth preferred embodiment.

The electric functional element 100 to be built-in is not limited to the capacitive element, and an inductor or a resistive element may be built-in.

Seventh Preferred Embodiment

Figure 15:
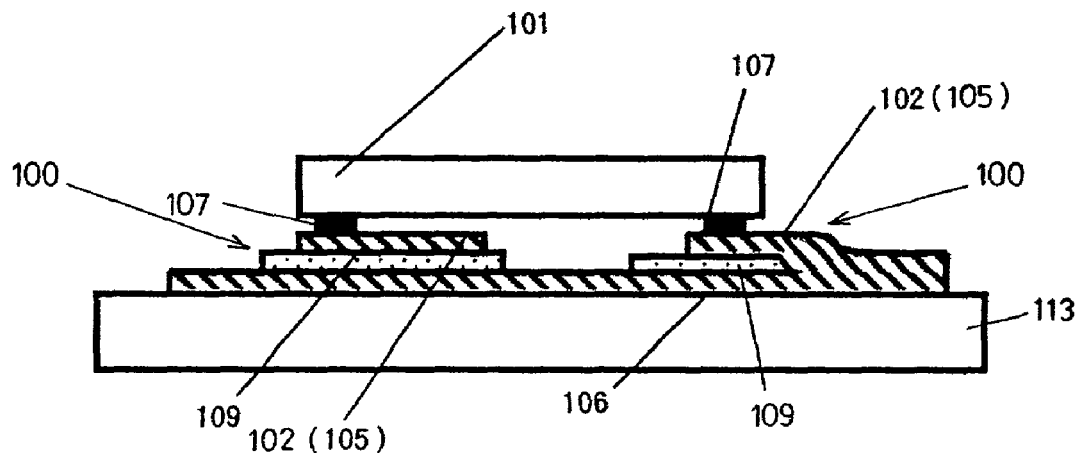
FIG. 15 is a cross-sectional view showing a schematic structure of semiconductor module relating to a seventh preferred embodiment of the present invention.

FIG. 15 is a cross-sectional view of schematic structure of semiconductor module relating to a seventh preferred embodiment of the present invention. FIG. 16 is a step cross-sectional view showing a schematic manufacturing method of multi-layer substrate used for the semiconductor module relating to the seventh preferred embodiment of the present invention.

In accordance with the first to sixth preferred embodiments, the electric functional element 100 is built-in within the multi-layer substrate 103. In contrast, in accordance with the seventh embodiment, the electric functional element 100 is formed on a part of the substrate surface.

As shown in FIG. 15, a lower internal wiring 106 is provided on a surface of a wiring substrate 113. The dielectric layer 109 is provided on an upper surface of the lower internal wiring 106. An upper internal wiring 105 is provided on an upper surface of the dielectric layer 109. The upper internal electrode 105 serves as the terminal electrode 102.

A part of terminals of the upper internal electrodes 105 for connecting to an earth terminal of the semiconductor device 101 is electrically connected to the lower internal electrode 106. The bump electrode 107 is electrically connected to the upper internal electrode 105 (terminal electrode 102).

In the semiconductor module with such structure relating to the present embodiment, height variations of the terminal electrodes 102 can be suppressed as in the above-described first and second embodiments. Thus, the multi-layer substrate 103 and the semiconductor device 101 can be flip-chip-connected with each other in a stable manner. Consequently, the semiconductor module with high yield rate can be obtained.

Further, as the electric functional element (capacitive element) 100 is formed at a position below the terminal electrode 102 (upper internal electrode 105) in the substrate thickness direction, an impedance becomes small due to the same reasons as in the described embodiments 1 and 2. As a result, the semiconductor module with excellent high frequency characteristic can be obtained.

Moreover, as the terminal electrode 102 serves as the upper internal electrode 105, the semiconductor module can be made compact as compared with the case that the upper internal electrode is provided separately.

The electric functional element 100 may be formed at the opposite surfaces of the wiring substrate 113 as in the seventh embodiment such that the semiconductor device 101 is mounted on the opposite surfaces of the substrate 113.

The electric functional element 100 to be built-in is not limited to the capacitive element, and an inductor or a resistive element may be built-in.

Next, a method of manufacturing the multi-layer substrate used for the semiconductor module relating to the present embodiment will be described with reference to FIGS. 16A and 16B.

Figure 16A:
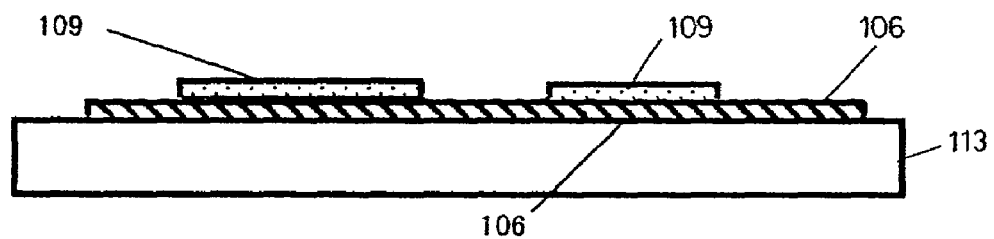
FIGS. 16A and 16B are step cross-sectional views showing a schematic manufacturing method of multi-layer substrate including an electric functional element used for the semiconductor module relating to the seventh preferred embodiment of the present invention.

Firstly, as shown in FIG. 16A, the wiring substrate 113 with an insulating layer made of alumina or glass-ceramic composite material is prepared. Then, a wiring pattern including the lower internal electrode 106 is printed on the surface of the prepared wiring substrate 113. The resultant wiring pattern is dried at 50° C. for 5 minutes. A slurry made of a conductive material powder and an organic binder is prepared. A pattern of dielectric layer is printed on the lower internal electrode 106 by using the prepared slurry. The formed pattern of the dielectric layer is dried at 50° C. for 5 minutes, so that the dielectric 109 is formed.

Figure 16B:
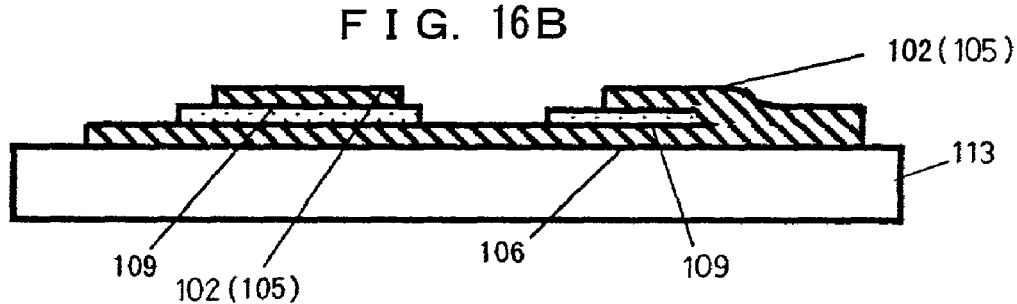

As shown in FIG. 16B, the upper internal electrode 105 (the terminal electrode 102) is formed on the dielectric layer 109. The upper internal electrode 105 is formed by the same method as that of the lower internal electrode 106.

The bump electrodes 107 of the semiconductor device 101 are positioned with respect to the terminal electrodes 102. Then, the semiconductor device 101 is flip-chip-bonded to the wiring substrate 113. In this way, the semiconductor module is formed.

A conductive paste may be prepared by fully mixing and kneading metallic powder, an organic binder and a solvent. The metallic powder is not particularly limited, and for example, copper, silver, gold, palladium, platinum, nickel or alloys thereof may be appropriately selected depending on materials for sintered substrate, manufacturing conditions of the substrate and usage conditions.

Materials for the dielectric layer 109 are appropriately selected depending on a contained desired capacity value, a thickness of the dielectric layer 109, materials for the wiring substrate 113 or the terminal electrode 102. For example, when a lead based perovskite compound is used and a glass-alumina composite material is used for a green sheet for wiring substrate, a sintering temperature is usually set in a range of 850° C. to 950° C. and a sintering time is usually set in a range of 0.1 to 10 hours. A treatment atmosphere is not particularly limited, and atmosphere, nitrogen, hydrogen or mixed gases thereof may be used.

In the above-described embodiment, the example in which the internal wirings 105 and 106 and the dielectric layer 109 are printed with respect to the wiring substrate 133 made of alumina or the like has been described. Nevertheless, subsequent to the internal wirings 105 and 106 and the dielectric layer 109 being printed on not-sintered, i.e., green sheet, the green sheet with the internal wirings 105 and 106 and the dielectric layer 109 having been formed maybe sintered. The multi-layer substrate may be used as the wiring substrate 113.

Eighth Preferred Embodiment

Figure 17:
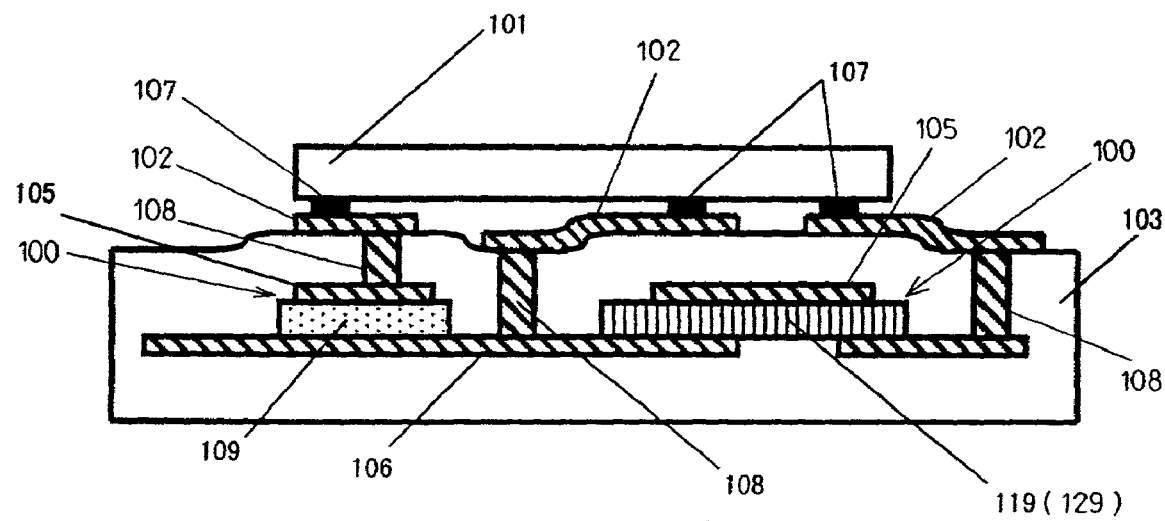
FIG. 17 is a cross-sectional view of a schematic structure of semiconductor module relating to an eighth preferred embodiment of the present invention.
Figure 18:
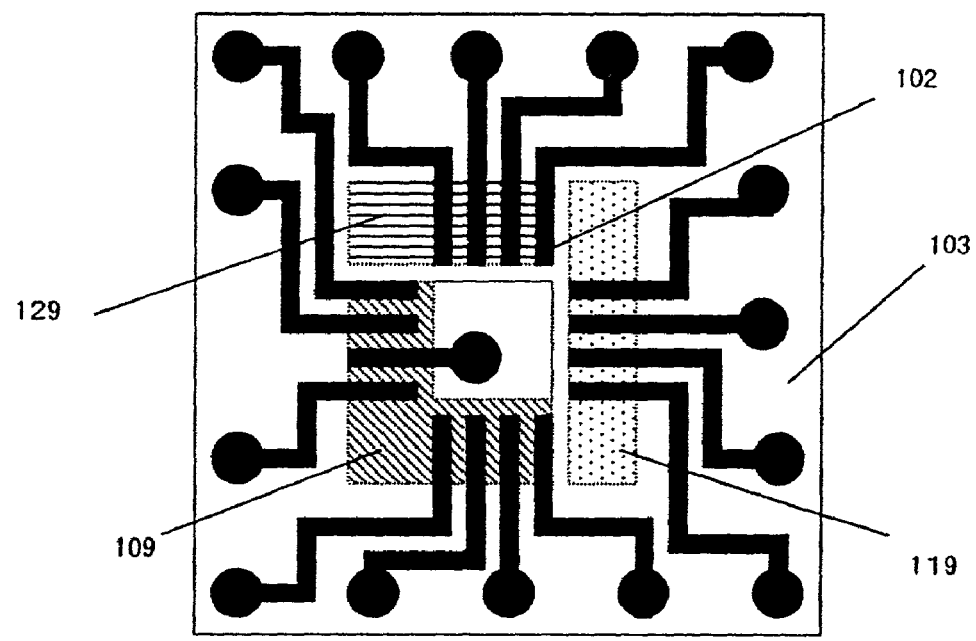
FIG. 18 is a plan view of the schematic structure of the semiconductor module relating to the eighth preferred embodiment of the present invention.

FIG. 17 is a cross-sectional view of a schematic structure of semiconductor module relating to an eighth preferred embodiment of the present invention. FIG. 18 is a plan view showing the schematic structure of the semiconductor module relating to the eighth preferred embodiment of the present invention. FIG. 19 is a step cross-sectional view showing a schematic manufacturing method of the semiconductor module relating to the eighth embodiment of the present invention.

In the first to the seventh preferred embodiments, one of capacitive element, inductor and resistive element is built-in within the multi-layer substrate. In the eighth embodiment, however, the example in which the electric functional element including a functional layer at which a resistor layer and a magnetic material layer are formed as well as a dielectric which is different from the insulating material layer of the multi-layer substrate which is built-in is illustrated.

As shown in FIG. 17, the dielectric layer 109, the resistor layer 110 and the magnetic material layer 129 are formed at the downward positions of the terminal electrodes 102 to be connected to the flip-chip-bonded semiconductor device 101 in the substrate thickness direction.

In accordance with the present embodiment, one of the dielectric layer 109, the resistor layer 119 and the magnetic material 129 is always provided at the downward position of all terminal electrodes 102 in the substrate thickness direction. Each of end portions of the layers 109, 119 and 129 is formed at a plain area that the terminal electrode 102 is not formed. Thus, the eighth embodiment has the following advantages. Namely, even though layers 109, 119 and 129 that have different characteristics for positions immediately below the terminal electrodes 102 are formed, one of the dielectric layer 109, the resistor layer 119 and the magnetic material layer 129 is always placed at the position below the terminal electrode 102 in the substrate thickness direction. Thus, height variations of the terminal electrode 102 are eliminated.

Next, a method of manufacturing the semiconductor module relating to the eighth embodiment will be described with reference to FIGS. 19A through 19C.

Figure 19A:
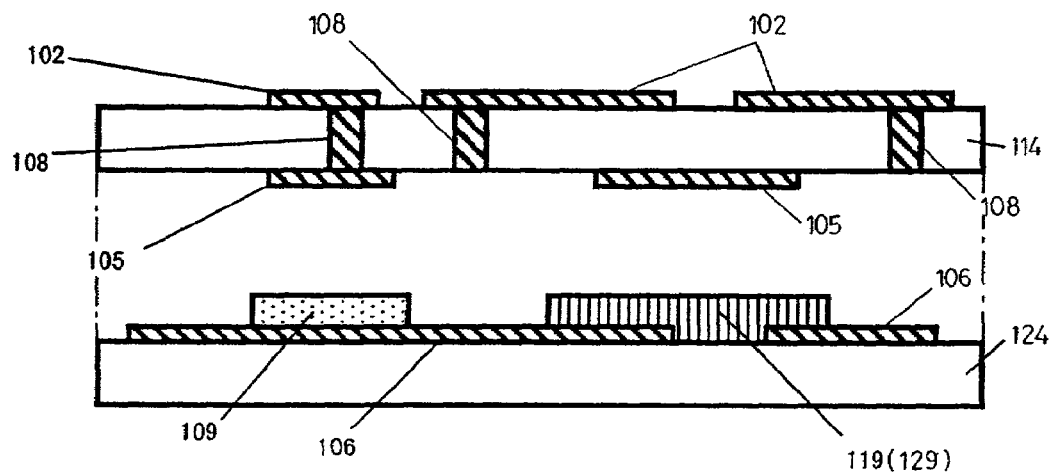
FIGS. 19A to 19C are step cross-sectional views showing a schematic manufacturing method of the semiconductor module relating to the eighth preferred embodiment of the present invention.

Firstly, as shown in FIG. 19A, a lower sheet-shaped insulating material 124 is prepared. Then, the lower internal electrode 106 is formed on one surface of the prepared lower sheet-shaped insulating material 124. The dielectric layer 109 is formed on the lower sheet-shaped insulating material 124 with the lower internal electrode 106 being formed thereon. The dielectric layer 109 is made by the same method as in the first preferred embodiment. Similarly, the resistor layer 119 and the magnetic material layer 129 are successively formed.

Next, an upper sheet-shaped insulating material 114 is prepared. A conductive material 108 is formed at the prepared upper sheet-shaped insulating material 114. A wiring pattern including the terminal electrode 102 is formed at one surface of the upper sheet-shaped insulating material 114. A wiring pattern including the upper internal electrode 105 is formed at the other surface of the upper sheet-shaped insulating material 114.

The upper sheet-shaped insulating material 114 and the lower sheet-shaped insulating material 124 are laminated and integrated at 80° C. under a pressure of 50 Kg/cm$^2$. Subsequently, the resultant laminated body is subjected to a binder removal treatment in a heating furnace at 600° C. at atmosphere. The laminated body subjected to the binder removal treatment is sintered within a range of 850° C. to 950° C. for 0.2 hours. In this way, the multi-layer substrate 103 with the electric functional element being built-in therein can be obtained.

Figure 19B:
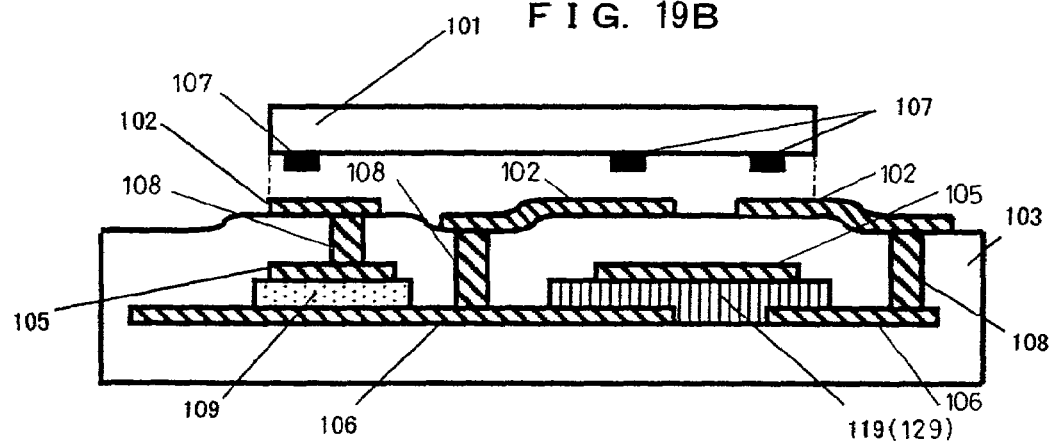
Figure 19C:
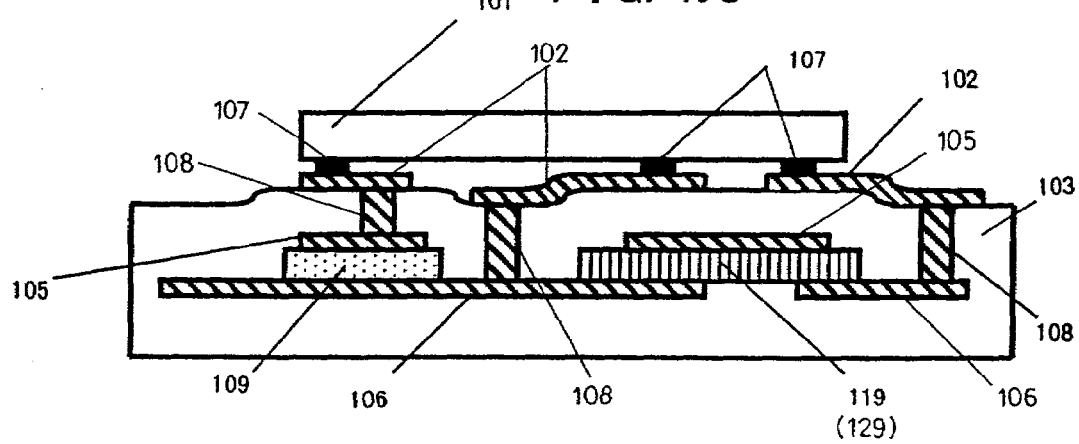

Thereafter, as shown in FIG. 19B, the bump electrodes 107 of the semiconductor device 101 are positioned with respect to the terminal electrodes 102. Then, the bump electrodes 107 are electrically connected to the terminal electrodes 102. In this way, the semiconductor device 101 is flip-chip-bonded to the multi-layer substrate 103, so that the semiconductor module shown in FIG. 19C is formed.

A mixture of $RuO_2$ powder, glass powder and a cellulose-based resin may be used for the material for the resistor layer 119.

Also in the semiconductor module with such structure, height variations of the terminal electrodes 102 can be suppressed. For this reason, the semiconductor device 101 can be stably flip-chip-connected to the multi-layer substrate 103.

Further, as a desired electric functional element 100 with excellent high frequency characteristic can be connected to each of the terminal electrodes 102 of the semiconductor device 101 at the shortest wiring distance, the multifunctional semiconductor module including a functional circuit with excellent high frequency characteristic can be realized.

The structure of the present embodiment may be applied to the case in which the semiconductor device 101 is mounted on the opposite surfaces of the multi-layer substrate 103 as in the fourth embodiment.

At least two of a capacitive element, an inductor and a resistive element may be built-in as the electric functional element 100 to be built-in.

Ninth Preferred Embodiment

Figure 20:
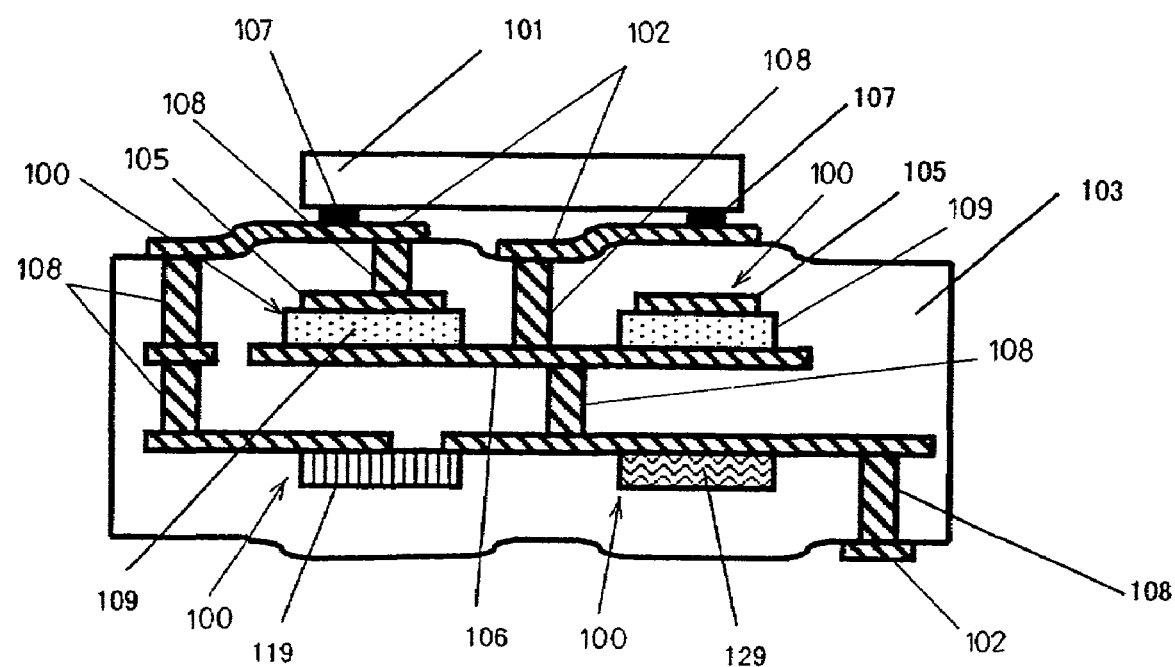
FIG. 20 is a cross-sectional view showing a schematic structure of semiconductor module relating to a ninth preferred embodiment of the present invention.

FIG. 20 is a cross-sectional view of a schematic structure of semiconductor module relating to a ninth preferred embodiment of the present invention.

As shown in FIG. 20, the dielectric layer 109 is formed at the downward position of each of all terminal electrodes 102 in the substrate thickness direction. The resistor layer 119 or the magnetic material layer 129 is formed at the different layer below the dielectric layer 109. The resistor layer 119 is preferably formed at a layer which is different from the layer that the magnetic material layer 129 is formed. In all layers that the dielectric layer 109, the resistor layer 119 and the magnetic material layer 129 are formed, the dielectric layer 109, the resistor layer 119 and the magnetic material layer 129 are always provided at substrate areas at downward positions of the terminal electrodes 102 in the substrate thickness direction.

The resistor layer 119 is not particularly limited, and may be appropriately selected depending on a sintering temperature, a resistivity and a temperature characteristic. For example, a mixture of an $RuO_2$ powder, a glass powder and a cellulose-based resin may be used.

The magnetic material layer 129 is not particularly limited, and may be appropriately selected depending on a sintering temperature, a permeability, a magnetic loss and a temperature characteristic. For example, NiZnCu-based, NiZn-based, MnZn-based and MgZn-based spinel ferrites and garnet ferrites may be used. In particular, NiZnCu-based spinel ferrite is useful due to its large electric resistivity and relatively low sintering temperature.

Each of the dielectric layer 109, the resistor layer 119 and the magnetic material layer 129 is formed, by a printing method or the like, on a sheet-shaped insulating material on which a wiring electrode is patterned by a printing method or the like.

In accordance with the semiconductor module with such structure, height variations of the terminal electrodes 102 can also be suppressed. Thus, the semiconductor device 101 can be stably flip-chip-bonded to the multi-layer substrate 103.

Further, a desired electric functional element 100 with excellent high frequency characteristic can be connected to each of the terminal electrodes 102 of the semiconductor device 101 at the shortest connection distance. For this reason, the multifunctional semiconductor module including a functional circuit with excellent high frequency characteristic can be realized.

In accordance with the present embodiment, the resistor layer 119 or the magnetic material layer 129 is formed at a layer which is different from the layer that the dielectric layer 109 is formed. Accordingly, the multi-layer substrate 103 that the electric functional element 100, into which a capacitive element, a resistive element and an inductor are incorporated, is built-in can be easily manufactured.

The structure of the present embodiment may be applied to the case in which the semiconductor device 101 is mounted on the opposite surfaces of the multi-layer substrate 103 as in the fourth preferred embodiment.

The electric functional element 100 to be built-in may house at least two of the capacitive element, the inductor and the resistive element.

Tenth Preferred Embodiment

Figure 21:
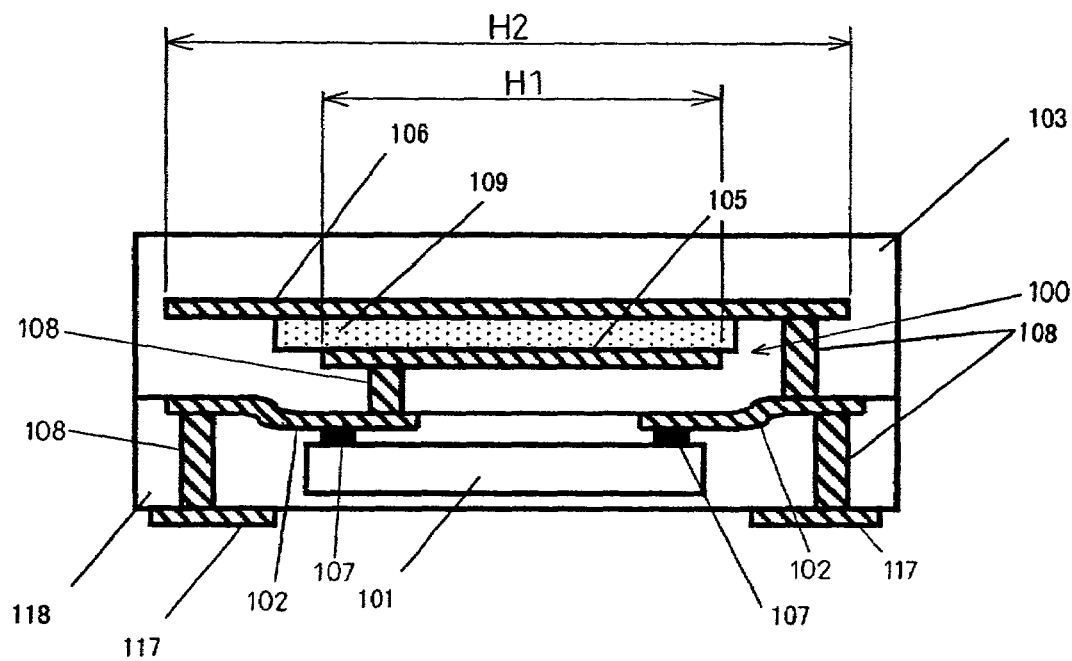
FIG. 21 is a cross-sectional view showing a schematic structure of semiconductor module relating to a tenth preferred embodiment of the present invention.
Figure 22:
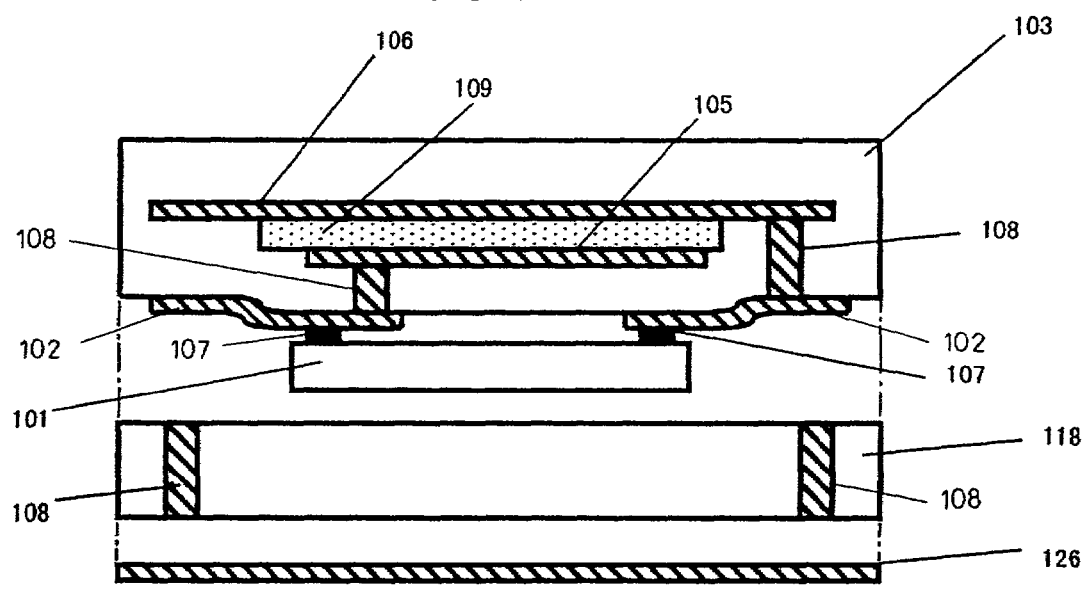
FIG. 22 is a cross-sectional view showing a schematic manufacturing method of the semiconductor module relating to the tenth preferred embodiment of the present invention.

FIG. 21 is a cross-sectional view showing a schematic structure of semiconductor module relating to a tenth preferred embodiment of the present invention. FIG. 22 is a cross-sectional view showing a schematic manufacturing method of the semiconductor module relating to the tenth preferred embodiment of the present invention.

As shown in FIG. 21, the terminal electrode 102 is connected respectively via the conductive material 108 to the upper internal electrode 105 and to the lower internal electrode 106, both of which are provided within the multi-layer substrate 103.

The dielectric layer 109 is selectively provided at the downward position of the terminal electrode 102 in the substrate thickness direction. Namely, as shown in FIG. 21, the dielectric layer 109 is always formed at the downward position of the terminal electrode 102 in the substrate thickness direction and is not formed at unnecessary areas other than such positions.

The semiconductor device 101 is flip-chip-bonded via the bump electrodes 107 to the terminal electrodes 102 on the multi-layer substrate 103 which houses such electric functional element 100. Further, the periphery of the semiconductor is filled with an insulating mixture 118. The mixture 118 is made of materials containing an inorganic filler and a thermosetting resin composition. The conductive material 108 is formed on the periphery of the semiconductor device 101 in the mixture 118. A wiring pattern 117 is formed on a surface of the mixture 118.

An epoxy resin and a phenol resin may be used as the thermosetting resin, and Alumina, silicon nitride, beryllia (BeO), MgO, aluminum nitride, $SiO_2$, and the like may be used as the inorganic filler. If necessary, a coupling agent, a dispersing agent and a colorant may be added to the thermosetting resin.

A method of manufacturing the semiconductor module relating to the presnet embodiment will be described with reference to FIG. 22.

The semiconductor device 101 is flip-chip-bonded to the multi-layer substrate 103 which is made on a basis of the method described in the first and the second preferred embodiments.

On the other hand, the mixture 118 of inorganic filler and uncured thermosetting resin is formed in a sheet. A through-hole is formed at the sheet-shaped mixture 118. A conductive paste is loaded into the through-hole formed at the mixture 118, so that the conductive material 108 is formed.

The multi-layer substrate 103 with the semiconductor device 101 being mounted thereto, the mixture 118 and a copper foil 126 are positioned with each other and then laminated. The resultant laminated body is heated and pressed by a press. In this way, the periphery of the semiconductor device 101 is filled with the mixture 118 of inorganic filler and thermosetting resin.

A step for making the mixture 118 of inorganic filler and uncured thermosetting resin into a sheet is performed as follows. Namely, an inorganic filler and a liquid thermosetting resin are mixed together, so that a paste kneaded material is prepared. Then, the resultant paste kneaded material is formed to a certain thickness and subjected to a thermal treatment, so that uncured sheet-shaped mixture 118 can be obtained.

An alumina powder is used as an inorganic filler. An epoxy resin is used as a thermosetting resin. In the step for making into a sheet, the mixture 118 is sandwiched between polyethylene terephthalate films subjected to releasing treatment and pressed to a predetermined thickness by heating and pressing. At this time, a thermal treatment is performed at a less or equal setting temperature of the thermosetting resin. In this way, uncured sheet-shaped mixture 118 can be obtained. For example, if a setting temperature of epoxy resin is 130° C., a thermal treatment temperature is 120° C. and a pressure is 10 kg/cm$^2$. In a case of performing a press, the mixture 118 must be formed so as to be thicker than the semiconductor 101 which is finally loaded into the mixture 118.

Thereafter, a through-hole is formed by a laser process method or a punching process. The conductive material 108 is formed by loading a conductive paste into the through-hole by a printing method or the like. The conductive pastes is made up by kneading conductive materials of powders of such as gold, silver or copper, and thermosetting resin made from an epoxy resin and a hardener.

The step for loading the mixture 118 into the periphery of the semiconductor device 101 is performed with a thermosetting resin in the mixture 118 being uncured. Specifically, this step is performed by pressing the laminated semiconductor device 101 and the mixture 118.

After the above-described loading step, the laminated body is kept at a heating temperature of 175° C. for an hour so that the thermosetting resin is hardened. Thus, the mixture 118 and the conductive material 108 are fully hardened. Finally, the copper foil 126 is processed by an etching method or the like, so that the wiring patter 117 is formed.

At the time of pressing the mixture 118 with respect to the semiconductor device 101, the mixture 118 is compressed by the semiconductor device 101. Thus, the mixture 118 placed between the copper foil 126 and the semiconductor device 101 is compressed stronger than the mixture 118 placed another positions. Consequently, the mixture 118 placed between the copper foil 126 and the semiconductor device 101 has a loading ratio of inorganic filler higher than that of the mixture 118 placed at another positions. The inorganic filler has a thermal conductivity even higher than that of the thermosetting resin. Accordingly, due to increased loading ratio of inorganic filler, the thermal conductivity of back surface of the semiconductor device 101 becomes high.

As height variations of the terminal electrodes 102 can also be suppressed in the semiconductor module relating to the present embodiment, the semiconductor device 101 can be stably flip-chip-connected to the multi-layer substrate 103. As a result, the semiconductor module with high yield rate can be obtained.

Further, since the electric functional element 100 is formed at the position below the terminal electrode 102 in the substrate thickness direction, the electric functional element can be provided at the shortest distance to the terminal electrode 102. Thus, the semiconductor module with excellent high frequency characteristic can be obtained.

Furthermore, any inorganic filler with high thermal conductivity may be added to the mixture 118 loaded into the periphery of the semiconductor 101. Thus, the semiconductor module with excellent radiating characteristic can be obtained.

The electric functional element 100 to be built-in is not limited to a capacitive element, and an inductor or a resistive element may be built-in.

Also, in accordance with the present embodiment, a longitudinal direction dimension H1 of the upper internal electrode 105 and a longitudinal direction dimension H2 of the lower internal electrode 106 are set as follows. Namely, the longitudinal direction dimensions H1 and H2 are set so as to be smaller than a dimension corresponding to a ¼ wavelength (preferably, a dimension corresponding to a ⅛ wavelength) of wavelength of electric signal to be inputted to the semiconductor device 101. Thus, apparent impedances on different positions along the length directions of the internal electrodes 105 and 106 substantially coincide with each other. Consequently, a capacitive element layer composed of the dielectric layer 109 fully acts as a bypass condenser.

Eleventh Preferred Embodiment

Figure 23A:
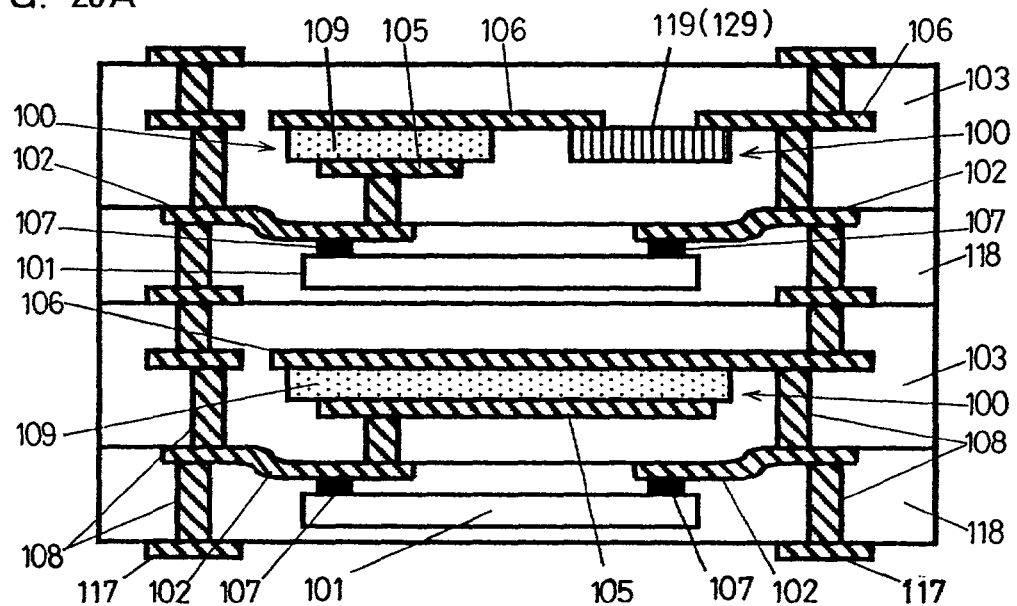
FIG. 23A is a cross-sectional view of a schematic structure of semiconductor module relating to an eleventh preferred embodiment of the present invention.
Figure 23B:
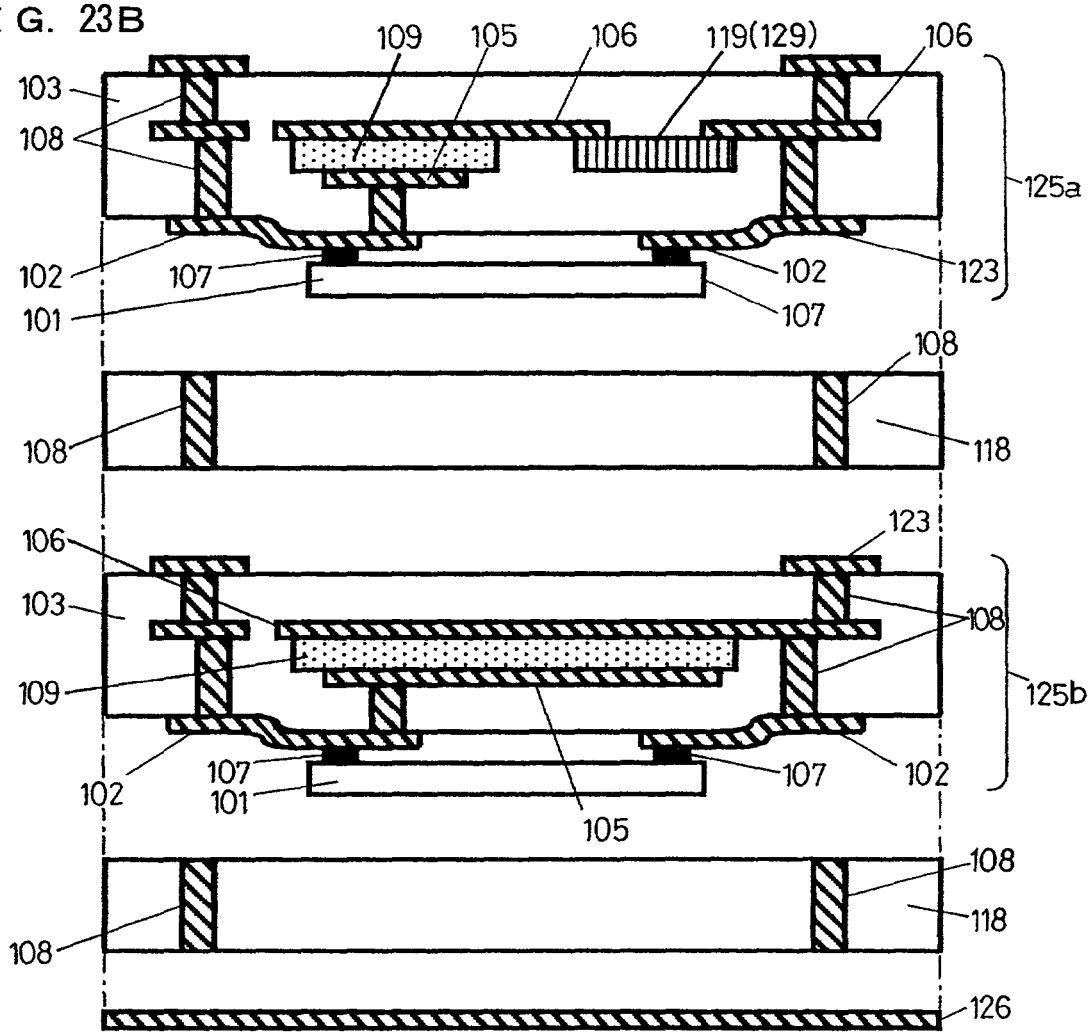
FIG. 23B is a cross-sectional view showing a schematic manufacturing method of the semiconductor module relating to the eleventh preferred embodiment of the present invention.

FIGS. 23A and 23B are cross-sectional views showing a schematic structure of semiconductor module and showing a schematic manufacturing method of the semiconductor module relating to the eleventh preferred embodiment of the present invention, respectively.

In accordance with the present embodiment, semiconductor module units described in the tenth preferred embodiment are laminated via a mixture of inorganic filler and thermosetting resin at which the conductive material 108 is formed.

As shown in FIG. 23A, the dielectric layer 109 and the resistor layer 119 or the magnetic material layer 129 are formed at downward positions of the terminal electrode 102 in the substrate thickness direction. The upper internal electrode 105 and the lower internal electrode 106 are provided at the opposite surfaces of each of the layers 109, 119 and 129 in the substrate thickness direction. Thus, the layers 109, 119 and 129 act as various types of electric functional elements 100.

A plurality of pairs in each of which the semiconductor device 101 is flip-chip-bonded on the multi-layer substrate 103 housing the electric functional element 100 are laminated and disposed. The sheet-shaped mixture 118 mixed with inorganic filler and thermosetting resin is loaded into the periphery of each of the semiconductor devices 101. The surface of the multi-layer substrate 103 at which the semiconductor device 101 is not mounted is connected via the conductive material 108 to the surface at which the semiconductor device 101 is mounted.

Next, a method of manufacturing the semiconductor module relating to the present embodiment will be described with reference to FIG. 23B.

Firstly, the dielectric layer 109, the resistor layer 119, the magnetic material layer 129, the upper internal electrode 105, the lower internal electrode 106 and the conductive material 108 are formed at an internal area of the multi-layer substrate 103 placed at the downward position of the terminal electrode 102 in the substrate thickness direction. The forming methods are the same as those of the above-described embodiments, and descriptions thereof will be omitted. The semiconductor device 101 is flip-chip-bonded on the prepared multi-layer substrate 103. In this way, semiconductor modules 125a and 125b are formed.

A plurality of sheet-shaped mixtures 118 each of which is obtained by processing a mixture of inorganic filler and uncured thermosetting resin into a sheet are prepared. The conductive material 108 is loaded into such mixture 118.

The semiconductor modules 125a, 125b, the mixture 118 and the copper foil 126 are laminated with the mixture 118 being sandwiched between the semiconductor modules 125a and 125b. At this time, the conductive material 108 is electrically connected to an electrode pattern 123 of the semiconductor module 125a and to the electrode pattern 123 of the semiconductor module 125b.

The conductive material 108 at the sheet-shaped mixture 118 which is placed at the outermost layer of the semiconductor module 125b is connected to a wiring for external connection (composed of the copper foil 126).

Then, the resultant laminated body is heated and pressed. The periphery of the semiconductor device 101 is filled with the mixture 118 thereby. At this time, a heating temperature that a thermosetting resin in the mixture 118 is not hardened is set.

Thereafter, the laminated body is subjected to a heating treatment at a temperature for enabling hardening of the thermosetting resin contained in the mixture 118. As a result, the thermosetting resin in the mixture 118 and the thermosetting resin in the conductive material are thoroughly hardened. Finally, the copper foil 126 is patterned by etching, so that the semiconductor module is accomplished.

For example, a plurality of same type memories that perform a high speed operation are built-in as a plurality of semiconductor devices 101. Thus, a mass memory can be made compact. Alternatively, an element which operates at high speed and includes a logic circuit and the semiconductor device 101 with different function such as a high speed operating memory can be built-in. Further, a light emitting element or a light receiving element may be mounted on the surface side, and an amplification element or the semiconductor device 101 which performs a logic computation may be built-in inside. Consequently, the semiconductor module which realizes all functions with one module and has excellent high frequency characteristic can be realized.

Also, in accordance with the semiconductor module relating to the present embodiment, height variations of the terminal electrodes 102 can be suppressed, so that the semiconductor device 101 can be stably flip-chip-connected. As a result, the semiconductor module with high yield rate can be obtained.

As the electric functional element 100 is formed at the downward position of the terminal electrode 102 in the substrate thickness direction, the electric functional element can be provided at the shortest distance to the terminal electrode 102. Thus, the semiconductor module with excellent high frequency characteristic can be obtained.

Further, the module housing a plurality of semiconductor devices 101 and a plurality of electric functional elements 100 can be three-dimensionally disposed with high density. Thus, the semiconductor module with excellent high frequency characteristic and significant high density is realized.

The electric functional element 100 to be built-in may include at least one of a capacitive element, an inductor and a resistive element.

Twelfth Preferred Embodiment

Figure 24A:
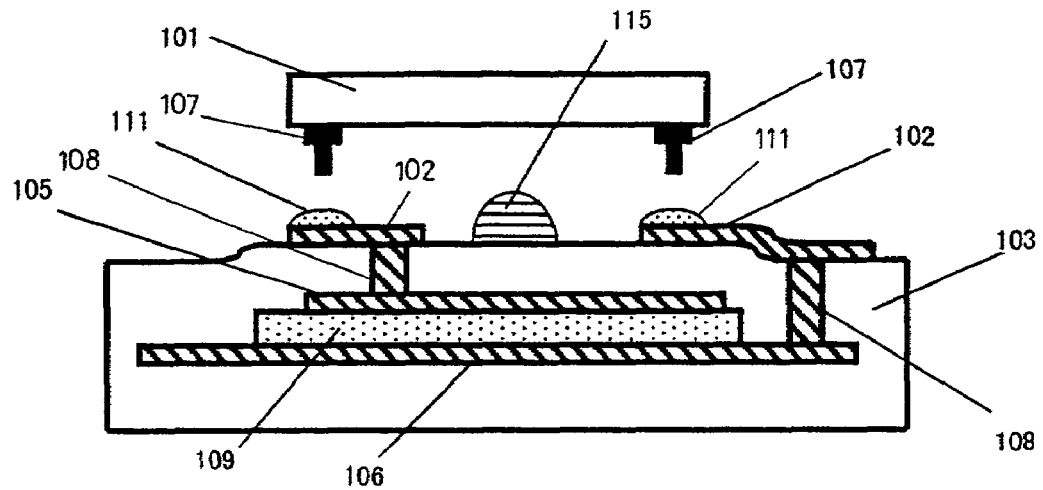
FIGS. 24A to 24C are step cross-sectional views showing a schematic manufacturing method of semiconductor module relating to a twelfth preferred embodiment of the present invention.
Figure 24B:
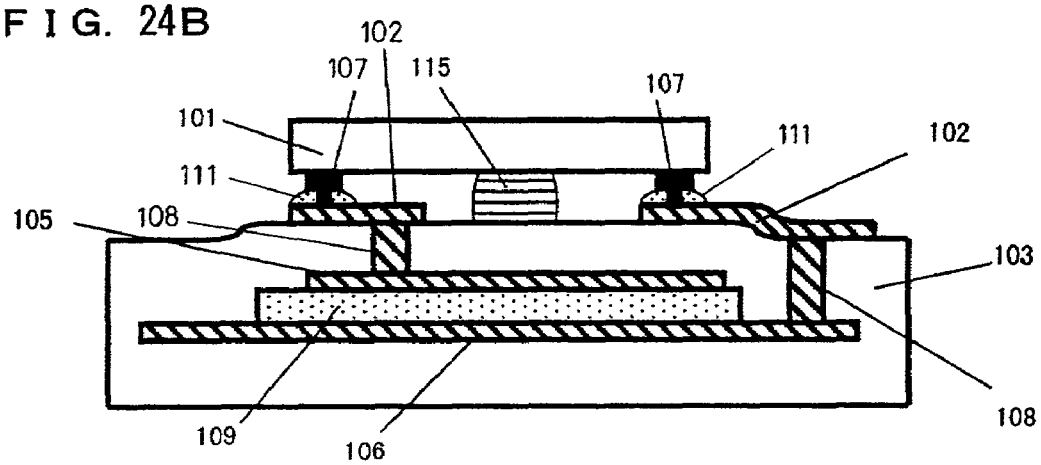
Figure 24C:
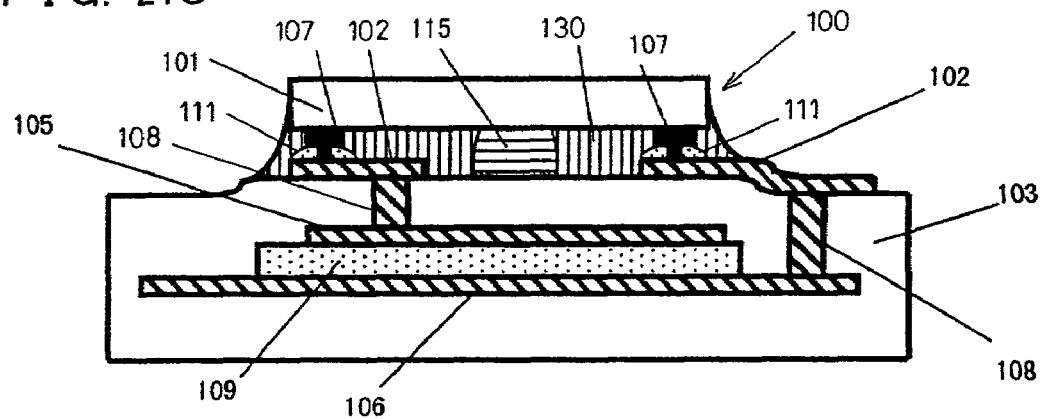

FIGS. 24A through 24C are step cross-sectional views showing a schematic manufacturing method of semiconductor module relating to a twelfth preferred embodiment of the present invention.

As shown in FIG. 24A, the bump electrode 107 made of, e.g., gold is formed on an input/output terminal (not shown) of the semiconductor device 101 by a wire bonding method or a plating method.

In addition to noble metals serving as a metal for composing the bump electrode 107, the electrode may be formed of a solder. The solder for making the electrode and a conductive adhesive may be used together. When the bump electrode 107 is formed using a wire with a diameter of 25 μm by a wire bonding method, a height of the bump electrode 107 is 60 μm to 100 μm.

On the other hand, the multi-layer substrate 103 is prepared. The following components are prepared for the multi-layer substrate 103. Namely, the terminal electrode 102 is prepared on a surface of the multi-layer substrate 103. The dielectric layer 109, the upper internal electrode 105 and the lower internal electrode 106 are provided at an internal area of the multi-layer substrate 103 placed at the downward position of the terminal electrode 102 in the substrate thickness direction. The conductive material 108 for electrically connecting the terminal electrode 102 and the internal electrodes 105 and 106 is provided at the internal area of the multi-layer substrate 103.

Then, a conductive adhesive 111 is supplied by a printing method or the like on the terminal electrode 102 of the multi-layer substrate 103. The conductive adhesive 111 prepared by dispersing gold flakes, silver flakes, particles of silver-palladium alloy in a resin may be used.

The thermosetting resin 115 is supplied by a dispenser or the like at a central portion of the region on the multi-layer substrate 103 that the semiconductor device 101 is mounted such that a height of the thermosetting resin 115 is higher than a total of the height of the bump electrode 107 and a thickness of the terminal electrode 102.

Thereafter, as shown in FIG. 24B, the semiconductor device 101 is bonded to the multi-layer substrate 103 with the bump electrode 107 being positioned with respect to the terminal electrode 102. At this time, a pressure for deforming the bump electrode 107 is applied from a back surface of the semiconductor device 101. Then, heat is also applied, so that the thermosetting resin 115 and the conductive adhesive 111 are hardened. The pressure at this time is 50 g per one bump electrode when the bump electrode 107 is made using a wire with a diameter of 25 μm. Thus, the bump electrode 107 is compressed and deformed to a height of 40 μm to 50 μm.

Then, as shown in FIG. 24C, a clearance between the semiconductor 101 and the multi-layer substrate 103 is sealed by a liquid resin composition 130. In this case, the resin composition 130 preferably contains an epoxy-based rein and a filler such as silica. Further, the filler is preferably uniformly dispersed within the resin composition 130.

In accordance with the present embodiment, subsequent to the bump electrode 107 being formed on the semiconductor device 101, the conductive adhesive 111 is supplied on the terminal electrode 102. Nevertheless, for example, after the bump electrode 107 is formed on the semiconductor device 101, by a pressure smaller than a pressure which is applied at a time of bonding the semiconductor device 101 on the multi-layer substrate 103 being applied to the bump electrode 107, the bump electrode 107 may be leveled at a uniform height. In this case, the conductive adhesive 111 is transferred to the leveled bump electrode 107. Then, after the semiconductor device 101 is mounted on the multi-layer substrate 103, the semiconductor device 101 and the multi-layer substrate 103 are heated and pressed, the bump electrode 107 is further compressed and deformed. In this way, an amount of conductive adhesive 111 to be transferred to the bump electrode 107 can be easily controlled.

Also, in accordance with the semiconductor module relating to the present embodiment, height variations of the terminal electrodes 102 can be suppressed. Thus, the semiconductor device 101 is stably flip-chip-connected to the multi-layer substrate 103. Accordingly, the semiconductor module with high yield rate can be obtained.

As the electric functional element 100 is formed at the downward position of the terminal electrode 102 in the substrate thickness direction, the electric functional element 100 can be provided at the shortest distance to the terminal electrode 102. Thus, the semiconductor module with excellent high frequency characteristic can be obtained.

Even if the terminal electrodes 102 had the height variations, the semiconductor device 101 can be stably connected to the multi-layer substrate 103 by deformation of the bump electrode 107.

The semiconductor device 101 may be mounted via the thermosetting resin 115 to the opposite surfaces of the multi-layer substrate 103.

The electric functional element 100 to be built-in is not limited to a capacitive element, and an inductor or a resistive element may be used.

Thirteenth Preferred Embodiment

FIGS. 25A to 25G are step cross-sectional views showing a schematic manufacturing method of semiconductor module relating to a thirteenth preferred embodiment of the present invention.

Figure 25A:
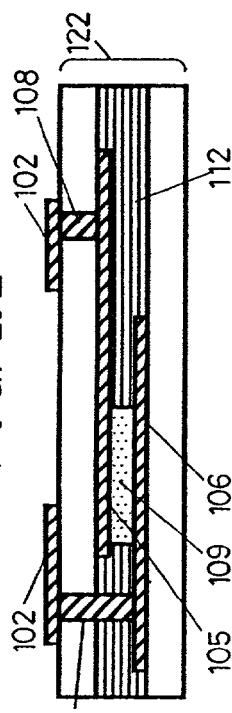
FIGS. 25A to 25G are step cross-sectional views showing a schematic manufacturing method of semiconductor module relating to a thirteenth preferred embodiment of the present invention.

As shown in FIG. 25A, a green sheet 112 and an upper sheet-shaped insulating material 114 are prepared. The green sheet 112 is attached to a support substrate 121 subjected to a releasing treatment. The upper sheet-shaped insulating material 114 is formed with the conductive material 108 and the upper internal electrode 105. A through-hole 116 is formed at the prepared green sheet 112. The through-hole 116 is formed by a hole making process using a puncher or a mold.

Figure 25B:
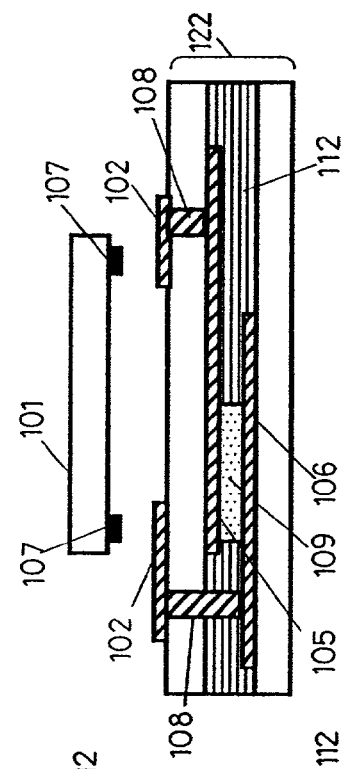

As shown in FIG. 25B, the green sheet 112 and the upper sheet-shaped insulating material 114 are positioned with each other and then laminated. After laminated, the support base material 121 is removed.

Figure 25C:
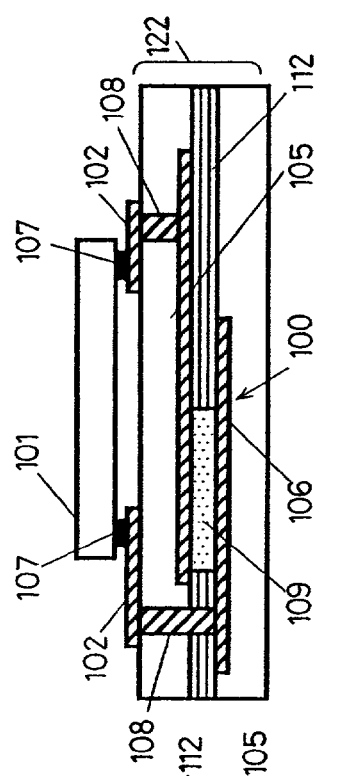

As shown in FIG. 25C, the dielectric layer 109 is loaded into the through-hole 116 by a printing method. A slurry prepared by mixing material powders of lead-based perovskite compound with an organic binder with a kneader such as a ball mill or a three-roll may be used for the dielectric layer 109.

Figure 25D:
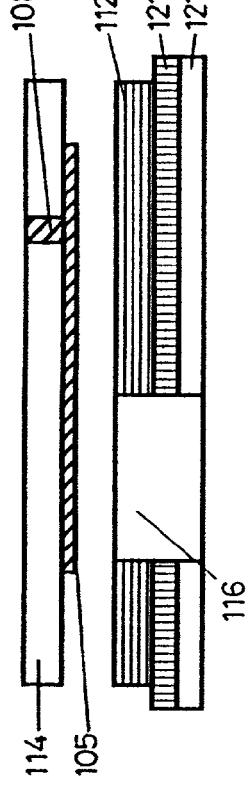

As shown in FIG. 25D, the lower sheet-shaped insulating material 124 is prepared. The lower internal electrode 106 and the conductive material 108 are formed at the lower sheet-shaped insulating material 124.

The lower sheet-shaped insulating material 124 is positioned with respect to the upper sheet-shaped insulating material 114 and the green sheet 112, then laminated together. In this way, a green sheet laminated body 122 is formed.

Figure 25E:
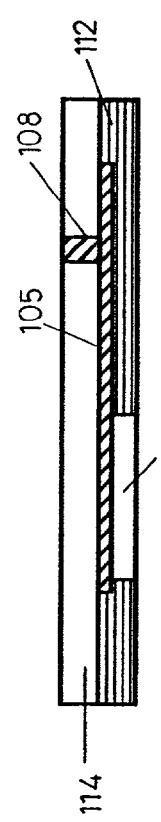

As shown in FIG. 25E, an electrode pattern of outermost layer including the terminal electrode 102 is formed on the surface of the green sheet laminated body 12. The green sheet laminated body 122 with the electrode pattern being formed thereat is sintered. A sintering temperature and a sintering time are appropriately set depending on each inorganic materials composed of the green sheet 112, the dielectric layer 109, the upper sheet-shaped insulating material 114 and the lower sheet-shaped insulating material 124. For example, when the upper sheet-shaped insulating material 114 and the lower sheet-shaped insulating material 124 are compose of glass-ceramic composite material made mainly of glass and alumina, and the dielectric layer 109 is composed of lead-based composite perovskite compound, the sintering temperature is set to 850° C. to 950° C., and the sintering time is set to 0.1 to 10.0 hours. A treatment atmosphere is not particularly limited, and for example, atmosphere, nitrogen, hydrogen or mixed gases thereof may be used.

Figure 25F:
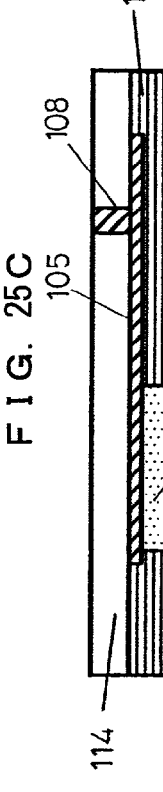
Figure 25G:
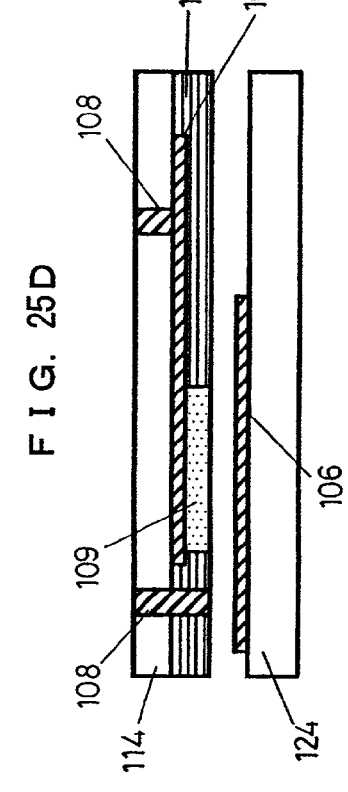

As shown in FIG. 25F, the semiconductor device 101 with the bump electrodes 107 being provided thereat is positioned with respect to the terminal electrodes 102. Then, the semiconductor 101 is flip-chip-bonded to the green sheet laminated body 122. In this way, the semiconductor module shown in FIG. 25G is accomplished.

In accordance with the semiconductor module relating to the present embodiment, height variations of the terminal electrodes 102 can be suppressed. Thus, the semiconductor device 101 can be stably flip-chip-connected to the multi-layer substrate 103. As a result, the semiconductor module with high yield rate can be obtained.

Further, as the electric functional element 100 is formed at the downward position of the terminal electrode 102 in the substrate thickness direction, the electric functional element 100 is provided at the shortest distance to the terminal electrode 102. Thus, the semiconductor module with excellent high frequency characteristic can be obtained.

In accordance with the present embodiment, the green sheet 112 for suppressing the height variations of the terminal electrodes 102 is provided over an entire area of the green sheet laminated body 122. Nevertheless, the green sheet 112 may be provided at least at the downward position of the terminal electrode 102 in the substrate thickness direction.

The electric functional element 100 to be built-in is not limited to a capacitive element, and an inductor or a resistive element may be used.

Further, the semiconductor device 101 can be mounted on the opposite surfaces of the green sheet laminated body 122.

Although the present invention has been described in detail by way of most preferred embodiments thereof, preferred combinations of components and arrangements thereof may be varied within the spirit and scope of the present invention as defined by the appended claims.

What is claimed is:

1. A semiconductor module comprising:
   a multi-layer substrate;
   at least four terminal electrodes provided on a surface of said multi-layer substrate;
   a capacitive element layer which is selectively provided at an internal area of said multi-layer substrate placed directly below all of said terminal electrodes in a substrate thickness direction, said capacitive element layer is encapsulated by a different material comprising the multi-layer substrate; and
   a semiconductor device which is flip-chip-bonded to said terminal electrodes, wherein the height variation of said terminal electrodes provided on the surface of said multi-layer substrate is equal to or less than 10 μm;

internal electrodes are provided on opposite sides of said capacitive element layer in the substrate thickness direction; and longitudinal length of said internal electrodes is smaller than a length equivalent to a quarter-wavelength of a wavelength of an electronic signal inputted into said semiconductor device.

2. The semiconductor module according to claim 1, wherein said capacitive element layer is one of a dielectric layer, a resistor layer and a magnetic material layer.

3. The semiconductor module according to claim 2, wherein said semiconductor device is flip-chip bonded to said terminal electrodes by use of a conductive adhesive.

4. The semiconductor module according to claim 1 comprising a conductive material which is provided at the internal area of said multi-layer substrate placed at a downward position of said terminal electrodes in the substrate thickness direction and which electrically connects said capacitive element layer and said terminal electrodes.

5. The semiconductor module according to claim 4, wherein said semiconductor device is flip-chip bonded to said terminal electrodes by use of a conductive adhesive.

6. The semiconductor module according to claim 1, wherein an area that said capacitive element layer is not present is provided at the internal area of said multi-layer substrate placed below a central portion of said semiconductor device in the substrate thickness direction.

7. The semiconductor module according to claim 1, wherein said terminal electrodes are provided on the opposite surfaces of said multi-layer substrate, and said semiconductor device is flip-chip-bonded to the terminal electrodes on the opposite surfaces of substrate.

8. The semiconductor module according to claim 1, wherein an internal electrode is provided at the opposite surfaces of said capacitive element layer in the substrate thickness direction, and a longitudinal direction of said internal electrode is set so as to be smaller than a dimension corresponding to a ¼ wavelength of wavelength of electric signal to be inputted to said semiconductor device.

9. The semiconductor module according to claim 8, wherein a longitudinal direction of said internal electrode is set so as to be smaller than a dimension corresponding to a ⅛ wavelength of wavelength of electric signal to be inputted to said semiconductor device.

10. The semiconductor module according to claim 1, wherein the internal electrode is provided at the opposite surfaces of said capacitive element layer in the substrate thickness direction, and the internal electrode is divided into a plurality of parts.

11. The semiconductor module according to claim 10, wherein said internal electrode is divided into a plurality of parts along the area that said terminal electrode is not formed.

12. The semiconductor module according to claim 1, wherein said capacitive element layer is provided on a surface portion of said multi-layer substrate.

13. The semiconductor module according to claim 1, wherein at least two of the dielectric layer, the resistor layer and the magnetic material layer are provided as said capacitive element layer at the same layer within said multi-layer substrate.

14. The semiconductor module according to claim 1, wherein at least two of the dielectric layer, the resistor layer and the magnetic material layer are provided as said capacitive element layer at different layers within said multi-layer substrate.

15. The semiconductor module according to claim 1, wherein the periphery of said semiconductor device is filled with a mixture containing an inorganic filler and a thermosetting resin composition.

16. The semiconductor module according to claim 15, wherein said inorganic filler contains at least one of alumina, AlN, silicon nitride and beryllia (BeO).

17. A semiconductor module, wherein a plurality of semiconductor modules according to claim 15 are provided, a back surface of said multi-layer substrate of one semiconductor module is laminated on a surface of said mixture of the other semiconductor module, and a conductive material for electrically connecting terminal electrodes of the respective semiconductor modules is provided within said mixture.

18. The semiconductor module according to claim 1, wherein at least one said capacitive element layer is substituted by an insulating layer having the same thickness as that of said capacitive element layer.

19. The semiconductor module according to claim 1 wherein an insulating material constituting said multi-layer substrate is a low-temperature sintered glass ceramics made mainly of a sintered body of inorganic material, and said capacitive element layer is a dielectric layer formed mainly of a lead-based perovskite compound.

20. The semiconductor module according to claim 1, wherein an insulating material constituting said multi-layer substrate is a low-temperature sintered glass ceramics made mainly of a sintered body of inorganic material, and said capacitive element layer is a resistor layer formed mainly of $RuO_2$.

21. The semiconductor module according to claim 1, wherein said capacitive element layer is continuous.

22. The semiconductor module according to claim 1, wherein said semiconductor device is flip-chip-bonded to said terminal electrodes by use of a conductive adhesive.

23. A semiconductor module comprising:

a multi-layer substrate;

at least four terminal electrodes provided on a surface of said multi-layer substrate;

a capacitive element layer which is provided at an internal area of said multi-layer substrate placed directly below said terminal electrodes in a substrate thickness direction, said capacitive element layer is encapsulated by a different material comprising the multi-layer substrate; and a semiconductor device which is bonded to said terminal electrodes, wherein the height variation of said terminal electrodes provided on the surface of said multi-layer substrate is equal to or less than 10 μm;

internal electrodes are provided on opposite sides of said capacitive element layer in the substrate thickness direction; and longitudinal length of said internal electrodes is smaller than a length equivalent to a quarter-wavelength of a wavelength of an electronic signal inputted into said semiconductor device.

24. The semiconductor module according to claim 23, wherein said capacitive element layer is continuous.

25. A multi-layer substrate comprising:

a multi-layer substrate main body;

at least four terminal electrodes that are provided on a surface of said multi-layer substrate main body and electrically connected to an external electric component; and a capacitive element layer which is selectively provided at an internal area of said multi-layer substrate placed directly below all terminal electrodes in a substrate thickness direction, said capacitive element layer is encapsulated by a different material comprising the multi-layer substrate, wherein the height variation of said terminal electrodes provided on the surface of said multi-layer substrate is equal to or less than 10 μm;

internal electrodes are provided on opposite sides of said capacitive element layer in the substrate thickness direction; and longitudinal length of said internal electrodes is smaller than a length equivalent to a quarter-wavelength of a wavelength of an electronic signal inputted into a semiconductor device.

26. The multi-layer substrate according to claim 25, wherein said capacitive element layer is one of a dielectric layer, a resistor layer and a magnetic material layer.

27. The multi-layer substrate according to claim 25 comprising a conductive material which is provided at said multi-layer substrate main body placed immediately below said terminal electrodes and electrically connects said capacitive element layer and said terminal electrodes.

28. The multi-layer substrate according to claim 25, wherein said capacitive element layer is continuous.

* * * * *